(12) United States Patent
Kawase

(10) Patent No.: US 7,198,885 B2
(45) Date of Patent: Apr. 3, 2007

(54) CIRCUIT FABRICATION METHOD

(75) Inventor: Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 10/482,101

(22) PCT Filed: May 19, 2003

(86) PCT No.: PCT/GB03/02131

§ 371 (c)(1),
(2), (4) Date: Jan. 20, 2004

(87) PCT Pub. No.: WO03/098696

PCT Pub. Date: Nov. 27, 2003

(65) Prior Publication Data

US 2004/0235227 A1    Nov. 25, 2004

(30) Foreign Application Priority Data

May 17, 2002  (GB) ................................. 0211424.7

(51) Int. Cl.
*G03F 7/26* (2006.01)
(52) U.S. Cl. ...................... 430/313; 430/311
(58) Field of Classification Search ................ 430/311, 430/313, 315, 319; 427/466; 438/29, 99, 438/237
See application file for complete search history.

(56) References Cited

U.S. PATENT DOCUMENTS

| | | | |
|---|---|---|---|
| 6,087,196 A | | 7/2000 | Sturm et al. .................. 438/29 |
| 6,150,668 A | * | 11/2000 | Bao et al. ...................... 257/40 |
| 6,413,790 B1 | * | 7/2002 | Duthaler et al. ............... 438/21 |
| 2004/0170762 A1 | * | 9/2004 | Newsome et al. .......... 427/256 |

FOREIGN PATENT DOCUMENTS

| | | |
|---|---|---|
| EP | 0 892 028 A2 | 1/1999 |
| EP | 0 962 984 A2 | 12/1999 |
| JP | 11-084121 | 3/1999 |
| WO | WO 99/19900 | 4/1999 |
| WO | WO 99/50889 | 10/1999 |
| WO | WO 99/53371 | 10/1999 |
| WO | WO 01/08242 A1 | 2/2001 |
| WO | WO 01/17029 A1 | 3/2001 |
| WO | WO 01/45147 A1 | 6/2001 |
| WO | WO 01/047045 A1 | 6/2001 |
| WO | WO 01/47045 A1 | 6/2001 |

* cited by examiner

*Primary Examiner*—Kathleen Duda
(74) *Attorney, Agent, or Firm*—Oliff & Berridge, PLC

(57) ABSTRACT

A thin film circuit is fabricated using a lithographic technique in combination with an inkjet printing technique. The lithographic technique, providing extremely high resolution, is used to fabricate transistor source and drain electrodes, parts of interconnections and circuit electrodes, enabling highly conductive materials to be used. Semiconductor regions, insulator regions, gate electrodes and other parts of the interconnections, and in particular interconnection crossover points, are patterned using an inkjet printing technique. A variety of materials can be used in the inkjet printing technique and the alignment concerns associated with the use of multiple lithographic steps and, in particular, with the use of plastics substrates, are substantially alleviated.

31 Claims, 20 Drawing Sheets

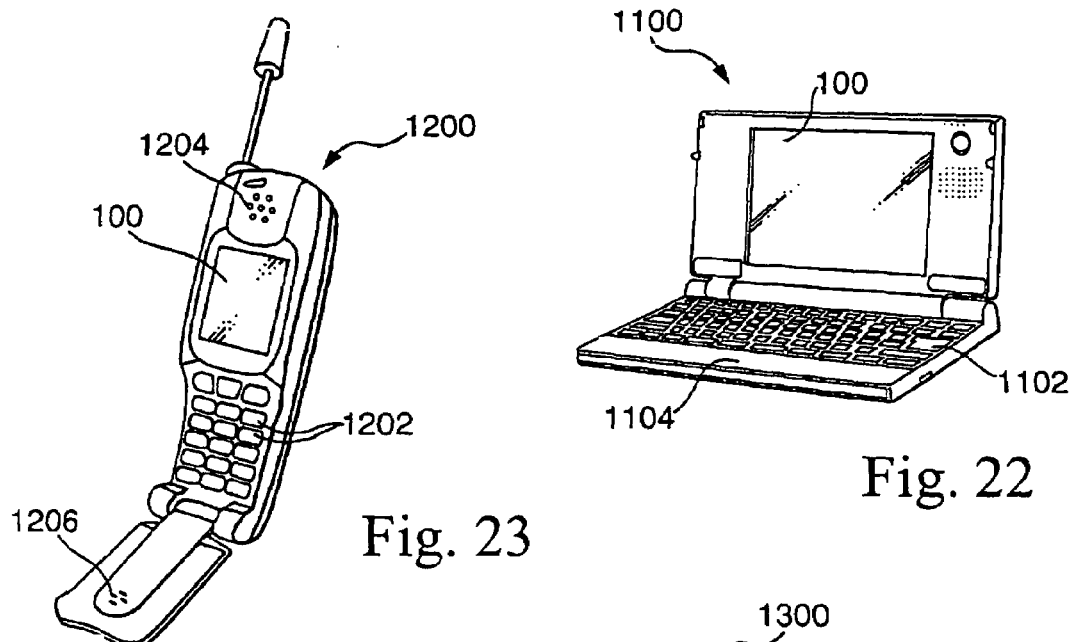
Fig. 22
Fig. 23
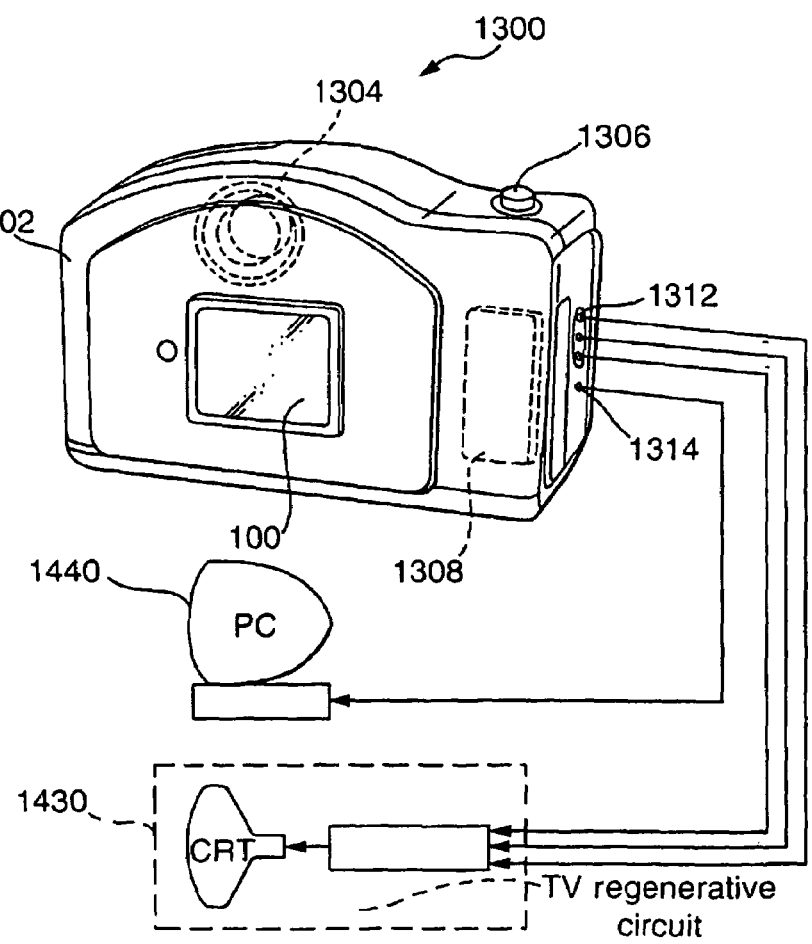
Fig. 24

CIRCUIT FABRICATION METHOD

The present invention relates to a circuit fabrication method, and in particular to a fabrication method for thin film transistor circuits.

Lithographic techniques using etch masks, such as photomasks or shadow masks are well proven in the fabrication of electronic circuits. Photolithography is an example of such a process and the photolithographic process is commonly used in the fabrication of electronic circuits in the form of integrated circuit devices because of the fine resolution and feature definition that can be achieved.

In one example of the photolithographic process a layer of photoresist material is deposited onto a material to be patterned, which is supported on a substrate. Spin coating is a commonly used technique to form the photoresist layer. The resist layer is then exposed to light through a photomask. Ultraviolet light is usually used for this process step. If a positive photoresist is used, those areas of the photoresist layer which are exposed to the ultraviolet light through apertures in the photomask can be dissolved to allow patterning of the material on the substrate through the patterned photoresist layer. The photolithographic process has been improved with many years of use and, with current technology, it is possible to achieve feature definition of less than 1 micron.

Currently, most thin film circuit fabrication using the lithographic technique is carried out using rigid substrates, such as glass or silicon. However, there is an increasing requirement to fabricate such circuits on plastics substrates, including flexible plastics substrates.

The photomask used in the photolithographic process is relatively rigid and there is very little expansion of the mask during the process step. However, expansion of the substrate does occur, especially if a plastics substrate is used, and distortion takes place between the mask and the layer to be patterned, which is supported on the substrate.

To fabricate a thin film semiconductor device, the photolithographic process needs to be used for each material in each layer of the device and therefore, several photomasks are required for each layer. For thin film circuits, interconnects are required between layers and these are usually provided by fabricating a hole through a layer to expose an underlayer and then depositing a material into the hole. Therefore, to fabricate a thin film transistor circuit at least four photolithography steps, each having an associated photomask, are used. To achieve fine definition of the circuit features, accurate alignment is required throughout and between all of the photolithography process steps and throughout all areas of the photomasks. This becomes difficult to achieve as the substrate is increased in size and becomes especially difficult if a flexible plastics substrate is used. However, because of the fine definition which can be achieved, the photolithographic process is very beneficial to use in order to define certain thin film circuit features such as the relatively long and thin circuit interconnections and addressing lines used in matrix addressing schemes for display devices. It is also a beneficial process to use in the fabrication of the source and drain electrodes of thin film transistors because channel regions of very short length can be achieved.

It has also been proposed to form thin film circuits by depositing a solution of a conjugated polymer in a solvent using an inkjet printing technique. By selection of appropriate conjugated polymer materials, conductor, semiconductor and insulator areas of the thin film circuit may all be deposited from solution using such a technique. However, high resolution patterning of electrodes using a conductive polymer such as poly-3-4-ethylenedioxythiophene (PEDOT) or polyaniline (PANI) is considered to be problematical due to the achievable resolution of the inkjet process using currently available techniques. For the fabrication of thin film transistors (TFTs), the provision of channels with channel lengths of less than 10 microns cannot reliably be achieved, and it is known that the drain current of a TFT is inversely proportional to the channel length. The inability to provide short channel lengths through the use of an inkjet process limits the use of such printed TFTs for certain applications, such as, for example, in display devices using current driven light emitting devices.

A variety of display devices, such as liquid crystal displays, electrophoretic displays, electrochromic displays or light emitting diode (LED) displays, are in widespread use. Recently, a further type of LED display has been proposed in the form of an addressable electroluminescent display. The electroluminescent display device comprises a mix of organic materials such as organic polymers or small molecules sandwiched between an anode and a cathode supported by a solid substrate, such as, for example, a glass, plastics or silicon substrate, the organic materials providing the light emitting elements of the display.

Display devices, and in particular liquid crystal display devices, are incorporated into products which are styled to meet consumer preferences. Mobile phones and wristwatches are typical examples of these products. As such, the displays are frequently required to possess a curved shape so as to blend with the product style and the curved shapes can be more easily achieved through the use of plastic substrates materials and, if necessary, the displays can be bent and fixed into position to assume the required profile during product fabrication.

Liquid crystal displays are also used in many other forms of portable equipment and are currently the preferred choice for the display screens of laptop computers. Primary requirements for this type of product are that they must be compact in size and light in weight in order to provide the required device portability. One area of concern for display screens in laptop computers is the fragile nature of the glass substrates used to contain the liquid crystal materials. The glass screens must be made thin in order to reduce the product size and weight but the screens must be made sufficiently robust to withstand the rigors of practical use. Techniques for toughening the glass substrates have been proposed which enable glass sheets of less than about 1 mm thickness to be used for display screens of laptop computers.

Other hand-held portable devices such as mobile phones also require the use of tough but thin and light display screen substrates because such devices must not only be very light and portable but also withstand dropping onto hard surfaces by a user. Hence, toughened glass substrates are also used in these devices but the relatively small screen size and the highly competitive cost demands of manufacture present additional fabrication difficulties.

To provide efficient display screen fabrication for these devices, the displays are usually manufactured using relatively large glass substrates which are arranged in face to face relationship with spacers in-between to provide the small air gap which is subsequently filled with the liquid crystal material. The large substrates are subdivided by scoring and then breaking along the score lines to provide the individual relatively small size display cells. However, the substrates must be made from toughened glass in order to be thin and light in weight, but the toughening process can make the relatively large glass substrates difficult to subdivide and cracking can occur along the break lines, which gives rise to waste during manufacture, and stresses can be set up in the glass which can lead to premature failure in use.

The plastics material for plastic substrates can be selected so as to provide very thin but very light displays, and because the substrate strength is inherent in the material, toughening processes are not required and the large plastic substrate sheets on which addressing scheme driving transistors are fabricated, can be more easily subdivided with far less risk of cracking along the break lines. Hence, it can be appreciated that plastic substrates lend themselves very favourably to the efficient and thus relatively low cost fabrication of liquid crystal displays. It is not surprising therefore that there is an increased demand for the use of plastic substrates in the many forms of display device in every day use. However, to date, the use of plastic substrates has been frustrated by the difficulties experienced in maintaining registration of the substrate with the many photomasks required by the lithographic techniques used to fabricate the thin film circuits used to drive and address the display pixels of the liquid crystal display devices.

It is well known that two main forms of addressing schemes are used in display devices. The first is what is commonly referred to as a passive matrix addressing scheme. Taking a liquid crystal display as an example, the display pixels are determined by arrays of electrodes respectively arranged as rows and columns on the opposing surfaces of the substrates used to confine the liquid crystal material. In essence, each pixel of the display resembles a parallel plate capacitor with a liquid crystal dielectric therebetween. When a voltage is applied between the electrodes defining a pixel, the liquid crystal material is influenced locally by the electric field generated to control the transparency of the liquid crystal material and, hence, the transparency of the particular pixel.

Addressing schemes of this type rely purely on data signals, in the form of voltage pulses, provided from the edges or boundary areas of the display. However, the electrodes of the arrays are relatively thin and have electrical resistance and this resistance is proportional to electrode length. Therefore, when a voltage pulse is applied to an electrode, some of the applied potential drops along the electrode and if this is not properly controlled, non-uniform brightness of the displayed image can occur.

Active matrix addressing schemes are, therefore, increasingly being adopted for liquid crystal displays. In a liquid crystal display active matrix addressing scheme, at least one thin film transistor (TFT) is provided at each pixel of the display to drive the liquid crystal material. Because of the physical layout of the display, the TFTs must be fabricated over a relatively large area of the display substrate. The two most common types of TFT used as the pixel driver transistors are those where the layer of semi-conductor material comprises either polysilicon or amorphous silicon. With either type of device, the silicon material must be deposited at the required locations at each pixel through the use of an expensive lithographic mask and using expensive specialist equipment, such as vacuum chambers. There are, therefore, not only the attendant problems of registering the mask on the substrate to ensure that the deposited silicon is accurately aligned with the materials deposited in earlier steps of the overall fabrication process, such as the electrodes used to supply the voltage pulses to the pixel located TFTs, but the TFT fabrication process itself, whether amorphous or polysilicon devices are used, is a relatively high cost process which significantly increases the cost of the display device. The TFT fabrication process is, principally, the reason why active matrix type liquid crystal displays are significantly more expensive than passive matrix type liquid crystal displays.

Silicon TFTs are non-transparent devices, so the area occupied by the TFTs on the display screen substrates desirably should be kept to a minimum so as to maximise the aperture ratio for the display: the aperture ratio is the proportion of the display which is able to pass light to a viewer. The same also holds true for the electrodes or conductor lines which are used to pass the voltage drive pulses to the pixel located TFTs. For a relatively small size display, e.g. a mobile telephone display, an aperture ratio of only about 50% is achievable, and even for relatively large displays it is difficult to achieve an aperture ratio of greater than about 70% to 80%. Hence, the electrodes, which are commonly known as data lines and gate lines in an active matrix addressing scheme, should be of minimum width so as not to further reduce the aperture ratio.

Additionally, as will be discussed in greater detail below, the channel length of the TFTs should be made as small as possible to provide the TFTs with adequate operational speed but the gate capacitance of the TFTs should be kept as small as possible whilst the channel width needs to be optimise. These are conflicting design requirements.

Hence, it can be appreciated that for display devices incorporating an active matrix addressing scheme it is desirable to a) minimise the channel length for the pixel drive transistors;
b) use highly conductive materials for the data lines and gate lines used to address the pixels of the display
c) minimise the width of the data lines and gate lines so as to minimise degradation of the aperture ratio.
d) minimise the overlap between a gate electrode and a drain electrode (or a source) so as to minimise the capacitance on the gate electrode.
e) maximise the channel width without a large increase in the gate electrode capacitance.

All of these characteristics can be achieved by patterning the source and drain electrodes, at least part of the circuit interconnections, and the pixel electrodes through the use of a lithographic technique, such as photolithography. For example, because of the fine resolution achievable by the photolithographic process, a channel length (i.e. separation between the source and drain electrodes) of less than one micron can be provided. Furthermore, the source and drain electrodes can be provided as interdigitated patterns to achieve a relatively long channel width, both of which can be used to improve the operational performance of organic semiconductors. Moreover, highly conductive materials, such as gold, silver, platinum and palladium can be used to fabricate the circuit electrodes and interconnects, such as the gate lines and data lines, minimising the voltage drops of the signals applied along these lines and the delay of signal pulses in operation of the displays.

A further concern associated with the fabrication of thin film transistor circuits in general, and in particular for the addressing electrodes used in display device, is that it is frequently required for one conductive interconnect to crossover another conductive interconnect, but the two conductive interconnects must be electrically isolated from each other for the display to function. As an example, in an active matrix addressing scheme for a liquid crystal display the data lines and gate lines are arranged substantially orthogonal to each other in narrow spaces provided between the pixel electrodes. By virtue of this layout, with the electrodes arranged as arrays of horizontal row electrodes and vertical column electrodes, each horizontal row electrode will have several cross-over points with the vertical column electrodes; and vice versa. The provision of an insulator area at each of these cross-over points through the use of a lithographic technique has always proved particularly problematical because a separate lithographic mask must be used to define the insulator areas, with the attendant problems of ensuring that the mask is correctly and accurately aligned at each cross-over point throughout the entire area of the mask. This becomes particularly difficult to achieve with large plastics substrates as expansion, contraction or distortion of the substrate is likely to have occurred since the previous process step used to define a first of the electrode arrays.

Therefore, it has been realised with the present invention that a combination of a lithographic technique and an inkjet printing technique can be advantageously employed to fabricate circuit devices.

According to a first aspect of the present invention there is provided a method of fabricating a circuit comprising using a lithographic technique to provide on a substrate a patterned layer comprising a first area of a conductive material arranged between further areas of conductive material, and selectively depositing an insulator material using an inkjet printing technique extending over at least a part of the first area of conductive material to provide a localised region of insulator material for enabling a domain of semiconductor or conductor material to be provided extending over but isolated from the first area of conductive material and extending between the further areas of conductive material.

The first area may be provided as a continuous conductive strip and the further areas are provided as conductive strip-like segments, the continuous conductive strip and the conductive strip-like segments having paths including cross-over points and being arranged such that the continuous conductive strips and the conductive strip-like segments do not contact each other at the crossover points.

Advantageously, the end portions are fabricated as contact pads having a wider width than the strip-like segments.

The patterned layer may be patterned to provide pixel electrodes and the continuous conductive strips and the conductive strip-like segments are arranged substantially orthogonal to each other and extending between the pixel electrodes to provide an electrode array for an active matrix type display device.

Advantageously, the patterned layer is patterned to provide source and drain electrodes for a thin film transistor and the inkjet printed material is selected to provide a semiconductor region in contact with the source and drain electrodes, the method further comprising using an inkjet printing technique to provide an insulator layer over the semiconductor layer and a conductor material over the insulator layer to provide a gate electrode for the thin film transistor overlying the semiconductor region and spaced therefrom by the insulator layer.

Most preferably, the source and drain electrodes are patterned as interdigitated comb-like structures to provide the thin film transistor with a channel region having a relatively short length and a relatively long width.

The interdigitated comb-like structures are preferably arranged so that comb teeth of the comb-like source electrode and comb teeth of the comb-like drain electrode are interdigitated by an amount which is smaller than the width of the gate electrode.

The patterned layer may be patterned to provide non-conductive buffer regions at either end of the source and drain electrodes for accommodating the difference between the resolution of the lithographic technique used to provide the source and drain electrodes and the resolution of the inkjet printing technique used to provide the semiconductor region.

In a most preferred embodiment, the patterned layer is provided such that the source electrode is coupled to a first of the conductive strips, the drain electrode is coupled to a pixel electrode, and the gate electrode is fabricated to extend into contact with a second of the conductive strips arranged orthogonal to the first strip, such that the first and second strips function, respectively, as a data line and a gate line of an active matrix addressing scheme for a display device.

Advantageously, the inkjet printed insulator material at the cross-over point is selected to comprise a first insulator material and the insulator material over the semiconductor layer is selected to comprise an insulator material which differs from the first insulator material.

In an alternative embodiment, the continuous conductive strips are patterned to have a portion of increased width to provide a gate electrode for a thin film transistor, the method further comprising using an inkjet printing technique to provide an insulator layer over the gate electrode and extending over at least that portion of the continuous conductive strip at the crossover point with strip-like segments, depositing a conductive material using an inkjet printing technique to provide a first conductive region extending over the insulator layer to electrically couple the conductive strip-like segments, a second conductive region isolated from the first conductive region and extending over at least a portion of the insulator layer and into contact with one of the conductive strip-like segments to provide a source electrode for the thin film transistor, and a third conductive region isolated from the first and second conductive regions and extending over at least a portion of the insulator layer and into contact with a pixel electrode to provide a drain electrode for the thin film transistor, and depositing a semiconductor material using an inkjet technique onto an exposed region of the insulator layer overlying the gate electrode to provide a semiconductor region for the thin film transistor extending into contact with the source and drain electrodes, whereby the continuous conductive strips can function as gate lines, and the conductive strip-like segments in combination with the first conductive regions can function as data lines, for an active matrix addressing scheme for a display device.

In a further embodiment, the continuous conductive strips and/or the conductive strip-like segments are fabricated to comprise interconnects between one or more of the thin film transistor and/or to extend into contact with input, output and voltage supply terminals for an electronic circuit and provided as discrete areas in the patterned layer.

The method may comprise fabricating at least two thin film transistors, one of the thin film transistors being fabricated by depositing a first semiconductor material of a first conductivity type and another of the thin film transistors being fabricated by depositing a second semiconductor material of a second conductivity type opposite to the first type.

The first conductivity type may be selected to comprise an enhancement type semiconductor and the second conductivity type is selected to comprise a depletion type semiconductor.

The first conductivity type may be selected to comprise an n-type semiconductor and the second conductivity type is selected to comprise a p-type semiconductor thereby to provide a complementary logic type circuit.

The method of the present invention may further comprise fabricating resistive circuit components extending between discrete areas of the patterned layer.

The resistive circuit components may be fabricated by depositing a resistive material at localised regions using an inkjet printing technique.

Advantageously, the thin film transistor fabricated from the depletion type semiconductor may be arranged to function as the resistive circuit component.

The resistive material may comprise a soluble polymer or a colloid of a polymer or an inorganic material.

The semiconductor material may comprise an organic semiconductor material.

The conductor material of the gate electrode provided over the insulator layer may comprise a conjugated polymer or a colloid of an inorganic conductive material.

Preferably, the conductor material comprises a conjugated polymer or a colloid of an inorganic conductive material.

The insulator may comprise a soluble polymer material, a curable polymer material, or a colloid of a polymer or an inorganic material.

Advantageously, the printed insulator material at the cross-over point is selected to comprise the curable polymer material and the insulator material over the semiconductor layer is selected to comprise the soluble polymer material.

The patterned layer may comprise a metal or a conductive oxide material, and/or a conjugated polymer material.

Preferably, the patterned layer is provided as the metal or conductive oxide material as a first layer and the conjugated polymer material as a second layer overlying the first layer.

The substrate may comprise a flexible substrate and may be provided with alignment marks for aligning an inkjet head used in the inkjet printing technique relative to the substrate.

Preferably, the position of the inkjet head relative to the alignment marks is controlled using an active feedback control system.

According to a second aspect of the present invention there is provided an electronic device, an electrooptic device or a conductive interconnect fabricated in accordance with the first aspect.

The present invention will now be described, by way of further example only, with reference to the accompanying drawings in which, FIG. 1 shows a conductor layer supported on a substrate for use with the method of the present invention;

FIG. 22 is a schematic view of a mobile personal computer incorporating a display device fabricated in accordance with the method of the present invention;

FIG. 23 is a schematic view of a mobile telephone incorporating a display device fabricated in accordance with the method of the present invention; and FIG. 24 is a schematic view of a digital camera incorporating a display device fabricated in accordance with the method of the present invention.

Fabrication methods which permit the fabrication of a solution processed thin film transistor electronic circuit have been proposed based upon the selective local deposition of conductive, semiconductive and insulator materials as solutes in a solvent by an inkjet printing technique. Such a technique has also been proposed for the deposition of colloids, such as conductive materials, in solution. However, for certain electronic or electrooptic devices it is necessary to lay down relatively large electrode areas, such as the electrode areas associated with the pixels of electrooptic display devices. Furthermore, in such devices it is also necessary to lay down long but thin conductor lines which are required to have minimal electrical resistance. Whilst an inkjet printing technique can be employed for either of these tasks, it is relatively inefficient to print large electrode areas as an array of dots of conductive material. Moreover, whilst the resolution which can be achieved with an inkjet printing technique has improved over the last few years, the resolution obtainable is not yet able to match that provided by lithographic techniques. Additionally, the preferred materials for the highly conductive electrodes used to address the display pixels, such as the gate lines and data lines of an active matrix addressing scheme, are low electrical resistance metals or metal alloys of gold, silver, platinum or palladium, or metal oxides such as indium tin oxide (ITO). These materials themselves cannot be deposited by the use of an inkjet printing technique and whilst colloids of these materials can be deposited the conductivity does not match that of the pure metal or metal alloy. In order to improve the conductivity of the materials deposited from colloids, an annealing process can be used, but such an annealing process is not necessarily compatible with a flexible substrate because of the process temperatures which must be adopted to perform the annealing step.

With the present invention it has been realised that lithographic and inkjet printing techniques can be combined to advantage in the fabrication of devices, such as thin film transistor circuits. Hence, source and drain electrodes, parts of interconnections, and pixel electrodes can be patterned by lithography in the preferred materials for these circuit features and semiconductor regions, insulator regions, gate electrodes and certain other parts of interconnections, especially electrode cross-over points which are difficult to provide with a lithographic technique, can be advantageously patterned using an inkjet printing technique.

Figure 1:
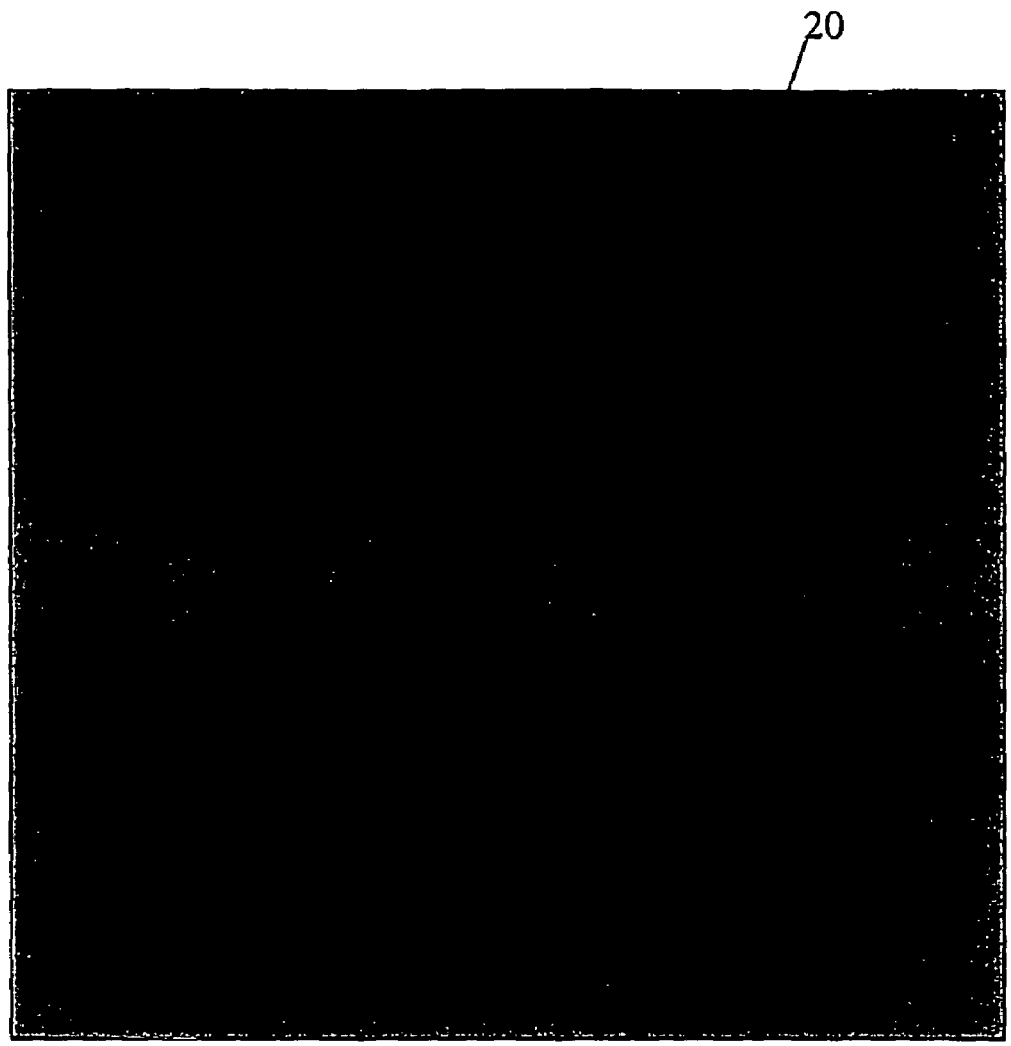
Figure 1:
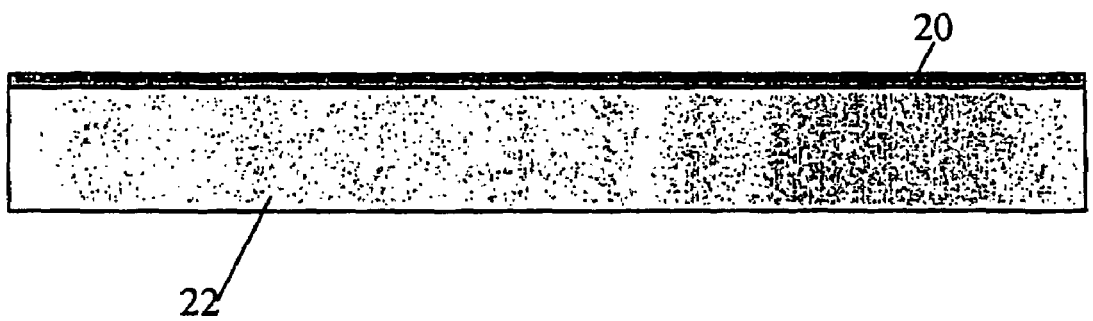

FIG. 1 shows a conductor film 20 which has been deposited on a substrate 22, such as by using an evaporation technique, as is well known in this art. By using an evaporation technique the conductor film 20 can be selected to comprise a high conductivity material, such as a metal or a metal alloy. Gold, silver, palladium, platinum or chromium, or alloys of these metals are examples of materials which are particularly suitable for this purpose. Also, the conductor film 20 can, if required, be deposited as a bi-layer of metals or metal alloys with other materials, such as a first layer of aluminium with an overlayer of platinum. Metal oxides such an ITO, indium oxide, or zinc oxide can also be used for this purpose. A bi-layer of calcium and aluminium may also be used. Electroplating can be applied to deposit the conductor film 20 as well.

The conductor film 20 can also be deposited from solutions of conjugated polymers or colloid materials by spin-coating. In this case, a vacuum process is not required to form a uniform layer, so it is effective in cost-conscious applications.

A photoresist layer is then deposited onto the conductor film 20, such as by spin coating, and then developed after exposing to ultraviolet light through a photomask, as is known in this art. Through the use of collimated light with a wavelength in the region of 400 nm, a resolution of less than 1 micron can be achieved, even with flexible substrates. Exposed areas of the resist material are then removed by dissolving in a suitable solvent (developer) to leave a resist mask having shaped apertures corresponding to the apertures in the photomask. The resulting structure is shown in FIG. 2 with selected areas of the conductor 20 exposed through the patterned photoresist mask 24.

Figure 2:
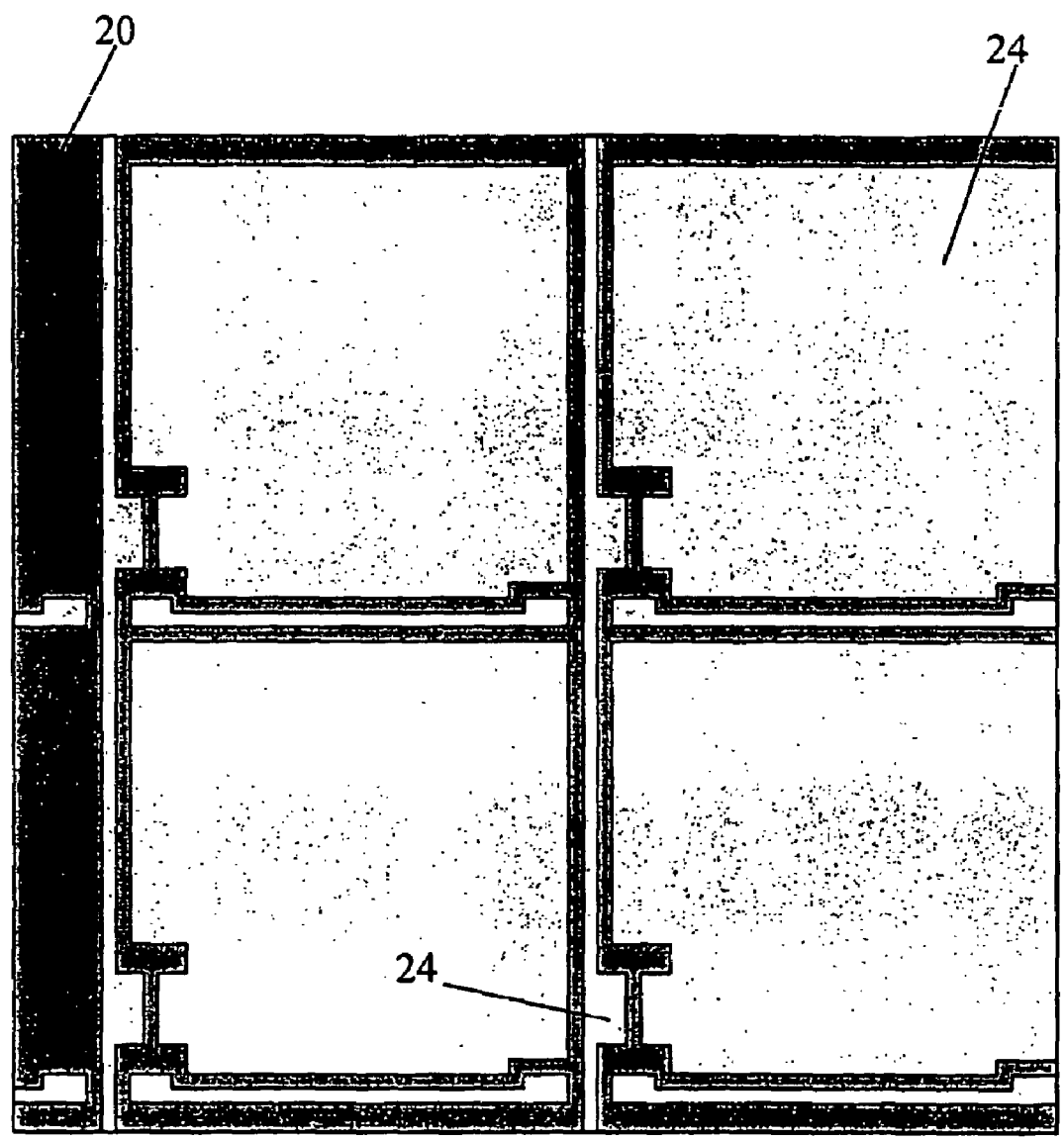
FIG. 2 shows a developed photoresist layer for use in patterning the conductor layer illustrated in FIG. 1.
Figure 2:
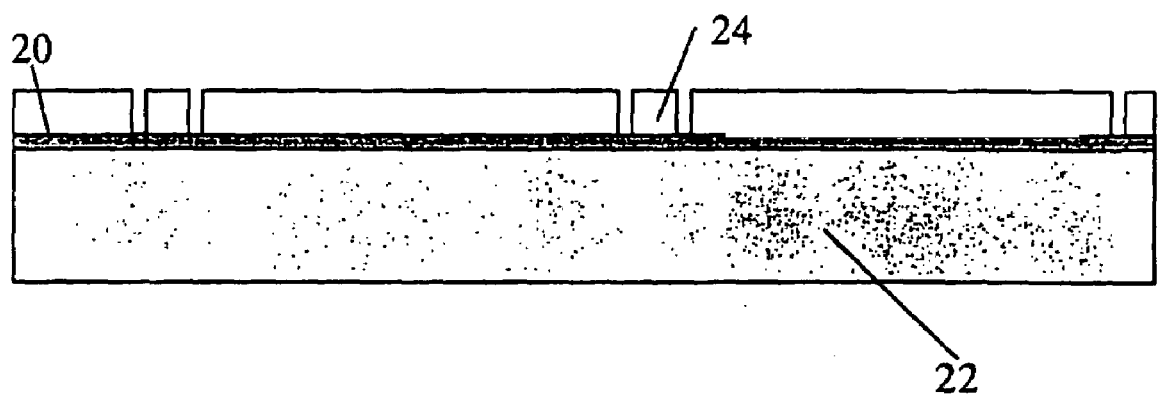

The structure in FIG. 2 is then etched using a dry or wet etching process to etch the exposed areas of the conductor layer 20 through the photoresist mask to expose an underlying layer, which is in the example shown is the substrate 22. The photoresist mask 24 is then removed to leave a patterned layer 26 of a conductive material on the substrate 22.

Figure 3:
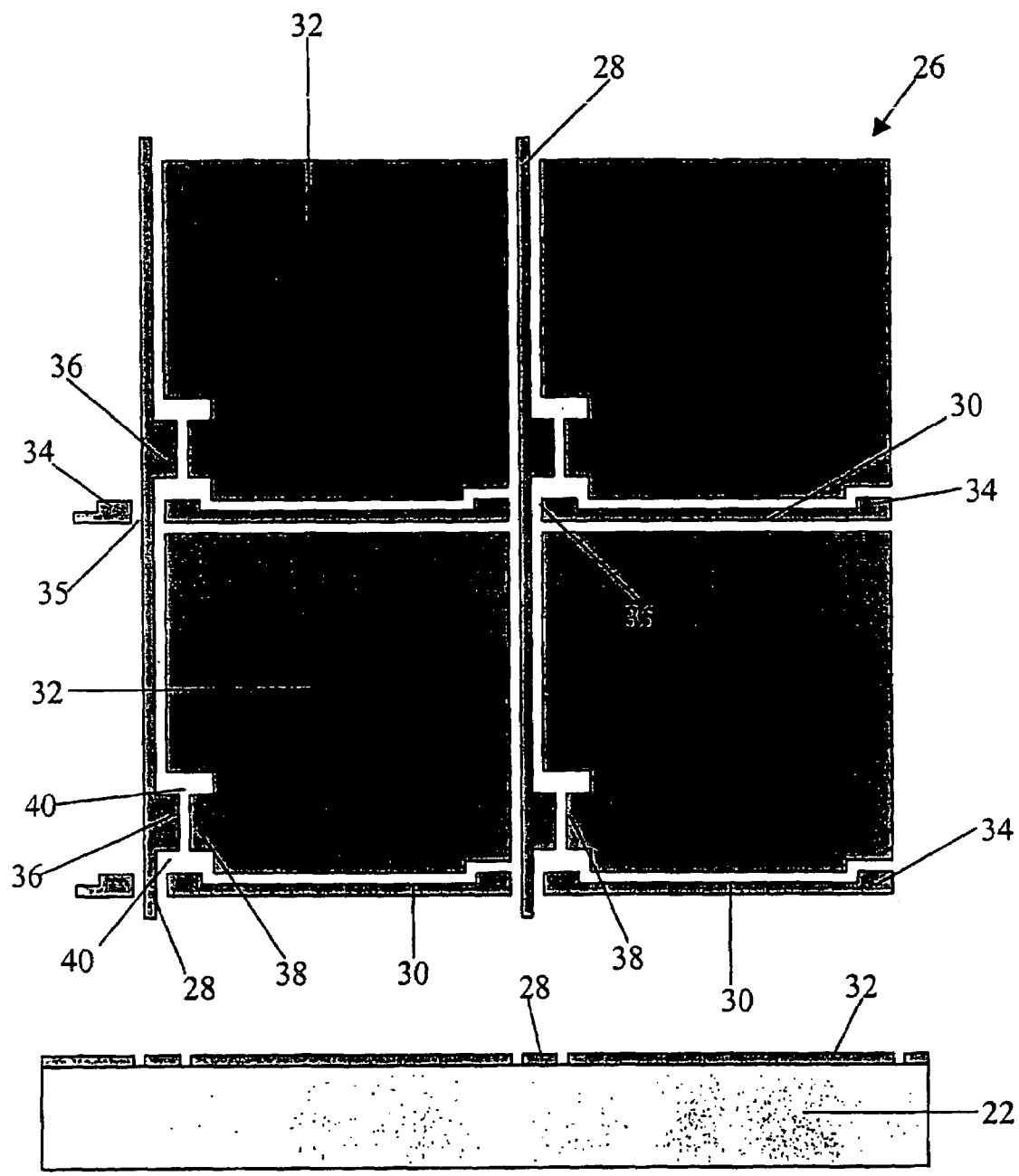
FIG. 3 shows the conductor layer of FIG. 6 after patterning through the developed photoresist layer shown in FIG. 2.

In the embodiment of the invention shown in FIG. 3 the patterned layer 26 includes discrete areas of the conductor material which are configured as data lines 28, gate lines 30 and pixel electrodes 32 for an electrooptic display device. It can be seen from FIG. 3 that the data lines are formed as continuous conductive strips but the gate lines are formed as conductive strip like segments to ensure that the data lines and gate lines do not contact each other at cross-over regions 35 where the paths of the respective lines cross each other. Although the data lines 28 are shown as continuous conductive strips in FIG. 3 it should be appreciated that the discrete areas of the patterned layer 26 could be patterned so that the data lines 28 are formed as the strip like segments and the gate lines 30 are formed as the continuous conductive strips. However, for reasons which will become apparent from the following description, it is preferable for the data lines to be configured as the continuous strips, as shown in FIG. 3.

The gate lines 30 are provided with end portions 34 which have a wider width than the strip like segments and which can be used to advantage in a subsequent step of the fabrication process.

The data lines 28 are provided with areas of increased width, each of which can act as an electrode, such as a source electrode 36 for a thin film transistor.

The pixel electrodes 32 are shaped to provide areas which extend towards the data lines 28 and can act as an electrode, such as a drain electrode 38, for a thin film transistor.

The data lines 28 and pixel electrodes 32 are also patterned to provide buffer regions 40 which, in essence, comprise non-conductive areas in which the conductor material has been removed during the etching step and which can be used to accommodate the difference in the very fine resolution achievable with the lithographic technique and the less fine resolution achievable with the inkjet printing technique used in subsequent process steps.

By using a lithographic technique to provide the patterned layer shown in FIG. 3, the data lines and gate lines can be made very thin but of a highly conductive metal or metal oxide material, and they can be very finely defined. Hence, the source and data lines can be fabricated to provide efficient transfer of data signals to the pixels of the device, with minimal voltage drops or pulse delays occurring along the data and gate lines, providing uniformity of display image. Additionally, because the lines can be made very thin and to a high resolution, the spacing required between the pixel electrodes to accomodate the orthogonally disposed data and gate lines can be minimised, thus maximising the aperture ratio for the device, providing a high contrast or brightness.

Figure 4:
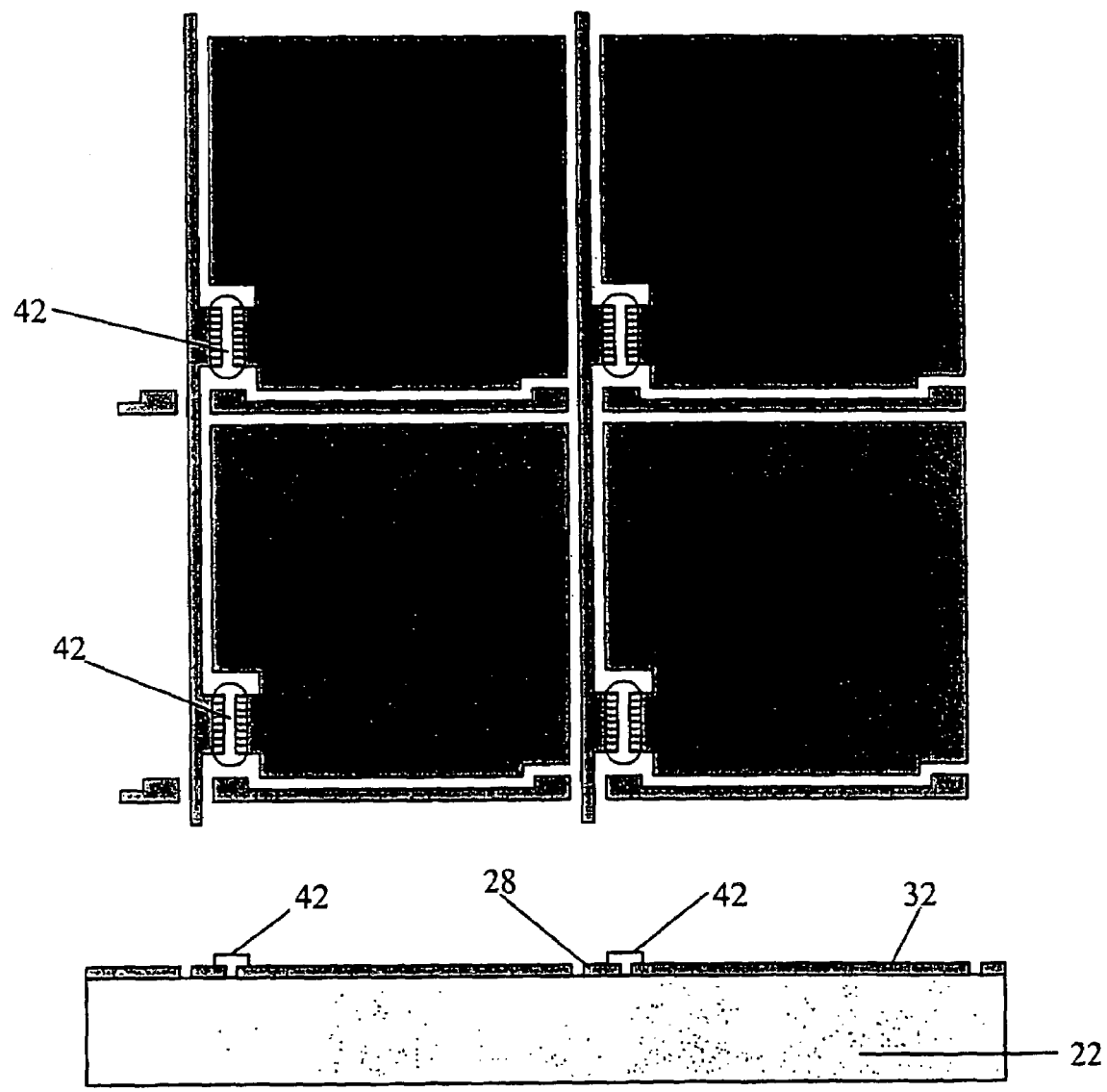
FIG. 4 shows semiconductor regions deposited onto the patterned conductor layer using an inkjet printing technique.

A semiconductor material is then deposited at localised regions using an inkjet printing technique to provide semiconductor domains or regions 42 in contact with the source and drain electrodes 36, 38, as shown in FIG. 4. It can be seen from this figure that the semiconductor regions 42 only contact the source and drain electrodes and do not contact the pixel electrodes 32 or gate electrodes 30 in view of the buffer regions 40 provided in the patterned layer. Any soluble organic semiconductor can be used such as Pc2Lu, Pc2Tm, C60, C70, TCNQ, PTCD1-Ph, TCNNQ, NTCDI, NTCDA, PTCDA, F16CuPc, NTCDI-C8F, DHF-6T, PTCD1-C8, polythiophene, poly(alkylthiophene) (such as P3HT), pentacene, copolymers of fluorene and bithiophene (F8T2), polythienylenevinylene, thiophene based oligomers, or phthalocyanine. Preferably, the semiconductor material is chosen to provide a high electron mobility as it is used to provide currents corresponding to data signals to a pixel of the electrooptic device.

Insulator material is then deposited at localised regions using an inkjet printing technique. In the embodiment shown in FIG. 5 the insulator material is deposited at two distinct types of localised region. The insulator material is deposited at the cross-over regions 35 of the data lines 28 and gate lines 30 to provide a bridge 44 of insulator material at each cross-over region which covers and electrically isolates the data lines 28 at these cross-over regions. Insulator material is also deposited over the semiconductor regions 42 to provide an insulator layer 46 over each semiconductor region to act as a gate dielectric.

The insulator material may comprise any soluble or curable polymer material or a colloid of a polymer or inorganic material. Suitable soluble polymer materials include poly(vinylphenol) (PVP), poly(methyl methacrylate) (PMMA), polycarbonate (PC), polystyrene (PS), polyolefin, polyacrylamide, poly(acrylic acid), novolak resin, resol resin, the precursor polymer of polyimide. The curable polymer material may comprise an epoxy resin. A precursor of an inorganic material, such as $SiO_2$ may also be provided to form the insulator layer 46.

The bridges 44 of insulator material are, preferably, formed so that they cover the data lines at the bridge regions and extend to contact but not to cover the end portions 34 of the strip like segment gate lines 30. Because the bridges 44 act to electrically isolate the gate lines 30 from the data lines 28 in the finished circuit, a sufficient thickness of the insulator material forming the bridges 44 needs to be assured. Therefore, a curable polymer, such as epoxy resin, is preferably selected for the fabrication of the bridges 44 because all of the liquid deposited by the inkjet deposition process goes to a solid state and therefore it is easier to assure the required thickness of the insulator material. Also, by appropriate selection of the viscosity of the soluble polymer and/or by assisting the drying of the polymer, the extent of the bridges 44 can be controlled to ensure that electrical isolation is provided for the data lines 32 but that the end portions 34 of the gate lines 30 are not covered by the insulating polymer and remain therefore fully exposed for contact by a conductor material in a subsequent process step. Furthermore, different insulator materials may be provided to form stacked insulator layers. When one polymer solution is deposited onto a layer consisting of the other polymer, the polymer solution does not dissolve or destroy the existing (underlying) polymer layer, providing a multi-layer structure. Such a multi-layer structure is preferable to obtain an insulator layer of a relatively large thickness.

With regard to the insulator layers 46 to act as gate dielectric for the TFTs, the dielectric characteristic of the insulator material selected to provide the layers 46 is chosen so as not to degrade the operational performance of the TFTs. The trap state in semiconductor devices is a well documented phenomenon and occurs when the charge carriers are trapped in the semiconductor layer. The increase of trap states leads to low mobility or the increase of a threshold voltage, which are not desirable characteristics for TFTs. The interface between the semiconductor layer 42 and the insulator layer 46 is important to ensure that the trap state does not occur to an extent which impedes the operational performance of the device. The insulator material should be selected so that it is stable, does not contain excess free radicals, and does not react with the semiconductor material of the semiconductor layer 42. Hence, the insulator layer 46 may be fabricated from a soluble polymer selected to provide a good interface with the semiconductor material and may also be provided as a bi-layer structure in the form of a soluble polymer first layer and a curable polymer second layer to provide the required thickness of gate dielectric material. This is considered to be a particular advantage of using an inkjet printing technique as the materials deposited can be selected to provide the desired device performance.

Figure 5:
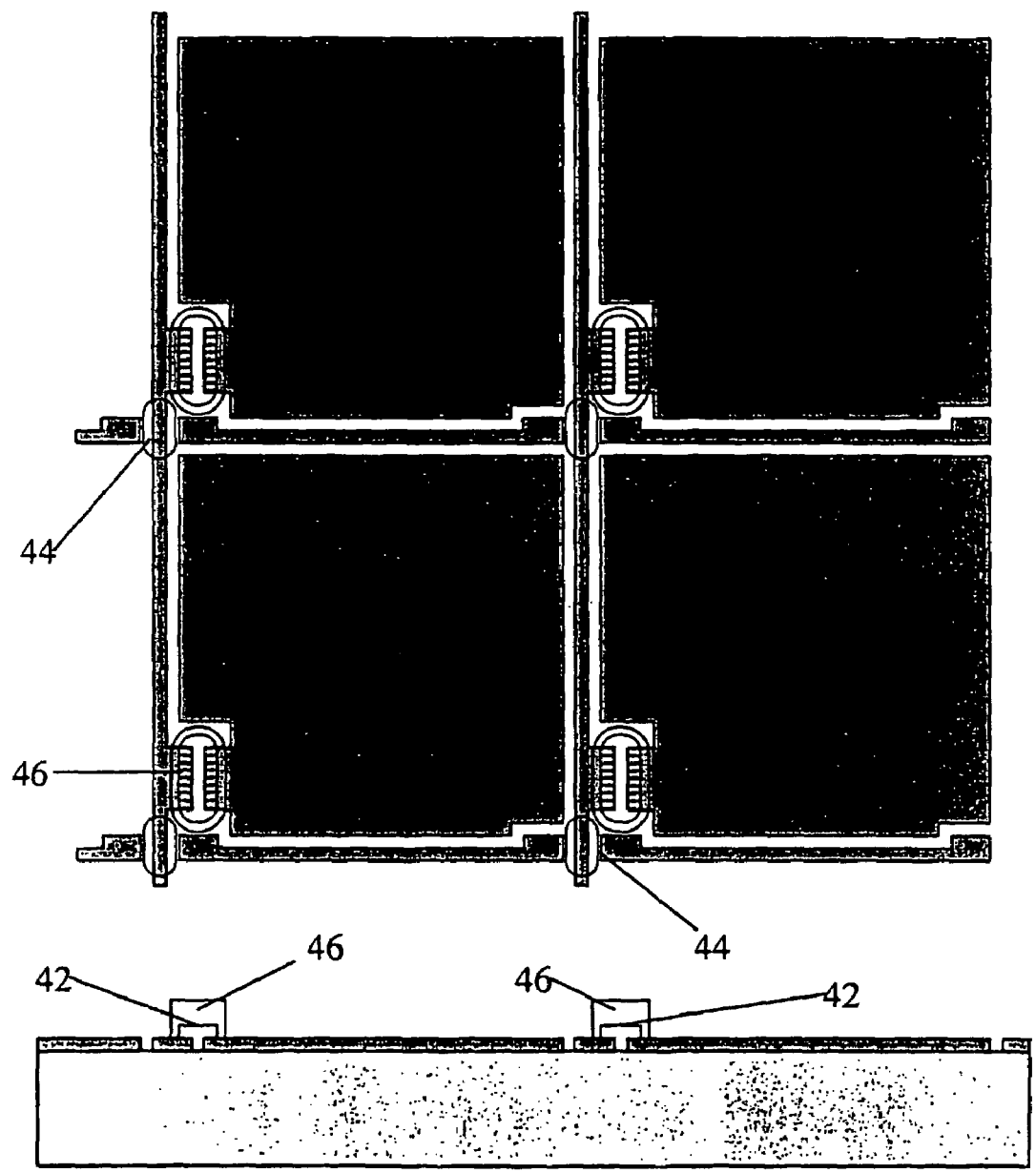
FIG. 5 shows insulator regions deposited onto the structure illustrated in FIG. 4 using an inkjet printing technique.

Conductor material is then deposited at localised regions onto the structure shown in FIG. 5 using an inkjet printing technique to provide gate electrodes 48 for the TFTs and also conductive interconnects 50 which act as conductive paths to electrically couple the conductive strip like segments of the gate lines 30.

The interconnects 50 are fabricated by depositing a conductive material over the bridge portions 44 and into contact with the end portions 34 of the gate lines 30. The increased width of the end portions ensures that good electrical contact can be made between the interconnects 50 and the gate lines such that the overall electrical conductivity of the gate lines is not significantly impaired by the use of the inkjet deposited interconnects 50.

The gate electrodes 48 are fabricated by depositing a conductive material onto the insulator layers 46 and these are arranged to extend into contact with the gate lines 30.

The gate electrodes 48 and interconnects 50 may be fabricated from a soluble conductor material, for example a conjugated polymer such as PEDOT or PANI, or a colloid of a metal, metal alloy or other conductive material, such as gold, silver, copper or carbon.

In the embodiments described above, the photolithographic step is used to provide continuous strip form data lines, segmented gate lines, pixel electrodes and the source and drain electrodes of the thin film transistors, with the subsequent layers being fabricated using an inkjet printing technique.

Figure 7:
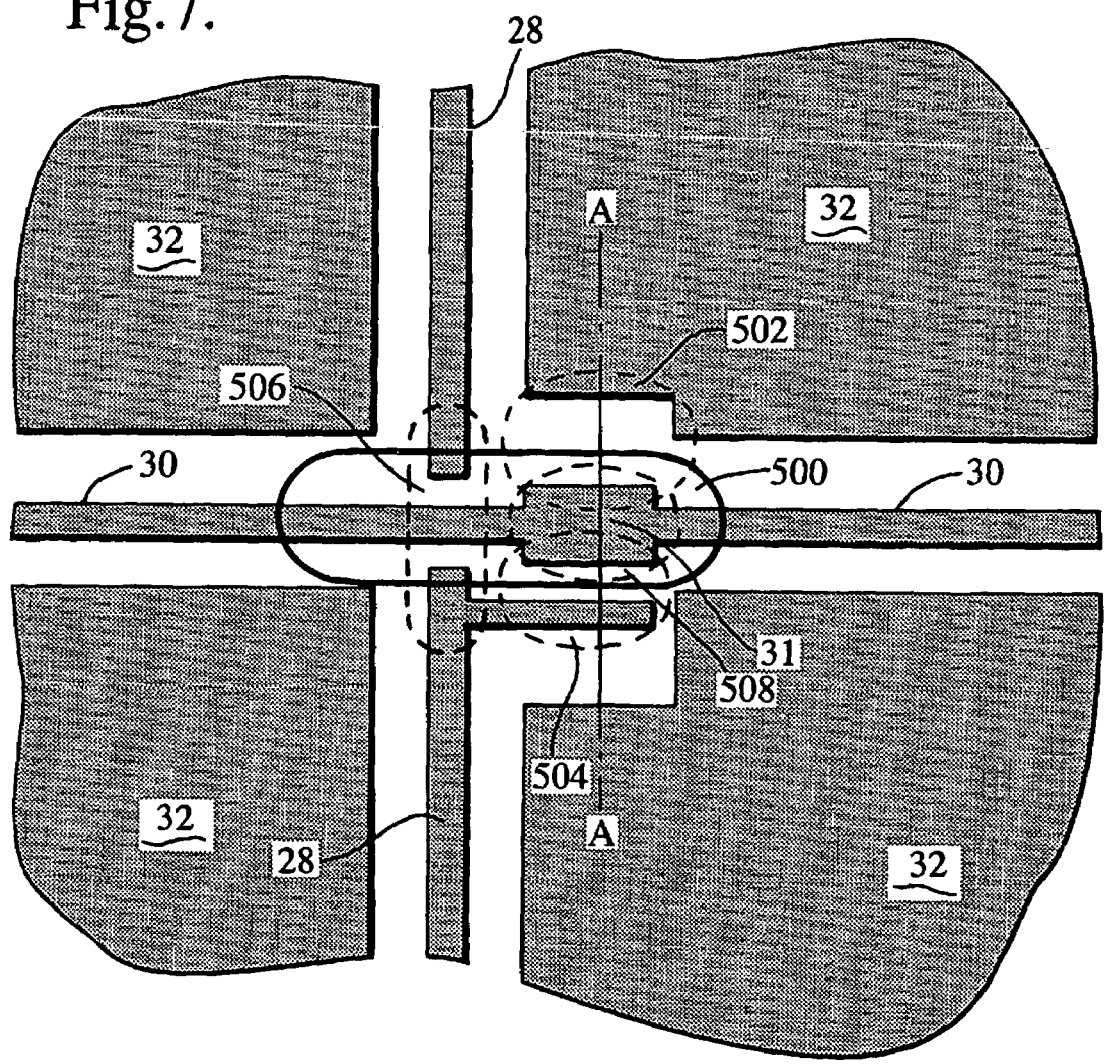
FIG. 7 shows an alternative structure having continuous gate lines and a bottom gate transistor fabricated in accordance with an embodiment of the present invention.
Figure 8:
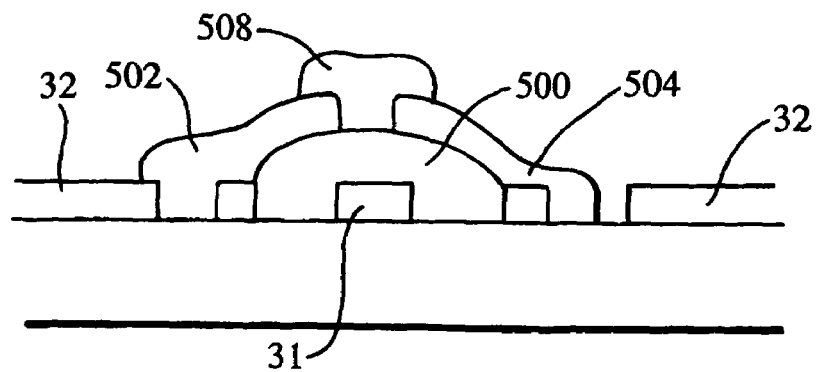
FIG. 8 shows a cross section of the structure illustrated in FIG. 7 through the line A—A.

However, the photolithographic step can, as an alternative, also be used to provide the continuous strip form gate lines, segmented data lines, pixel electrodes and the gate electrodes for the thin film transistors in order to enable what is commonly known as a bottom gate transistor to be subsequently fabricated onto the photolithographic patterned layer using the inkjet printing technique. FIGS. 7 and 8 show such a structure.

Referring to FIG. 7, in this embodiment of the invention the gate line 30 is formed as a continuous strip and the data line 28 is formed as the conductive strip like segments. The gate line 30 is provided with a region which is of increased width in comparison to the gate line 30 and which functions as a gate electrode 31 in the final transistor structure. A region 500 of an insulator material is then deposited over the gate electrode 31 using an inkjet printing technique. Conductor regions 502 and 504 are then provided over the region 500 of insulator material, again using an inkjet technique.

It can be seen from FIG. 7 that the insulator region 500 also extends to cover the cross-over region between the conductive strip like segments of the data lines 28 and the continuous strip like gate line 30. A conductive region 506 is deposited, also using an inkjet technique, which extends over the insulator region 500 and into contact with the conductive segments of the data lines 28. The region 506 can be deposited in the same inkjet printing step as the conductor regions 502 and 504. Hence, the region 506 forms a conductive bridge which conductively joins the segments of the data lines but which is also electrically isolated from the gate lines 30 by the insulator region 500. A semicondutor region 508 is then deposited onto the conductor regions 502 and 504 using an inkjet printing technique to complete the "bottom gate" TFT structure.

The arrangement shown in FIG. 7 enables continuous gate lines to be used and hence, the resistance of the gate lines can be provided at a relatively low level. The equivalent circuit of a number of the pixels is, in effect, a number of resistors connected in series, with capacitors connected to ground from nodes between the serially coupled resistors. If the resistance of the gate line increases, the effective resistance of the resistors of the equivalent circuit is increased, which gives rise to delays in the signal pulses passing along the gate lines. Hence, if the resistance of the gate lines is maintained as low as possible, as is the case with the embodiment shown in FIG. 7 because the continuous gate lines are fabricated using the lithographic technique, there is less delay to the signal pulses passing along the gate lines, which enables a higher operating speed to be used in a device incorporating this form of continuous gate line pixel arrangement.

For fast operation of thin film transistor circuits, the channel length L of the transistors, which is the spacing between the source and drain regions, must be made as small as possible, typically of a few microns, because the operational speed of a transistor is approximately proportional to $L^{-2}$, which is a product of the contributions of increase in drain current ($\propto L^{-1}$) and decrease in gate (input) capacitance ($\propto L^{-1}$). This is particularly important for semiconducting layers with relatively low mobility, such as soluble organic semiconductors.

The channel width W should be optimised so as to obtain sufficient drain current in a design, because the channel length L is limited by patterning resolution. However the increase of the channel width leads to an increase of the gate capacitance, which should be minimised. The gate capacitance involves two contributions which are from a channel region and gate-source (drain) overlap regions. A channel of less than 1 micron can be achieved by using a lithographic technique, but the width of a gate electrode is still larger than 10 microns due to the resolution limit of inkjet patterning. A simple structure of source and drain electrodes as shown in FIGS. 2–8 would, therefore, result in a large gate capacitance due to the gate-source(drain) overlap regions.

Figure 9:
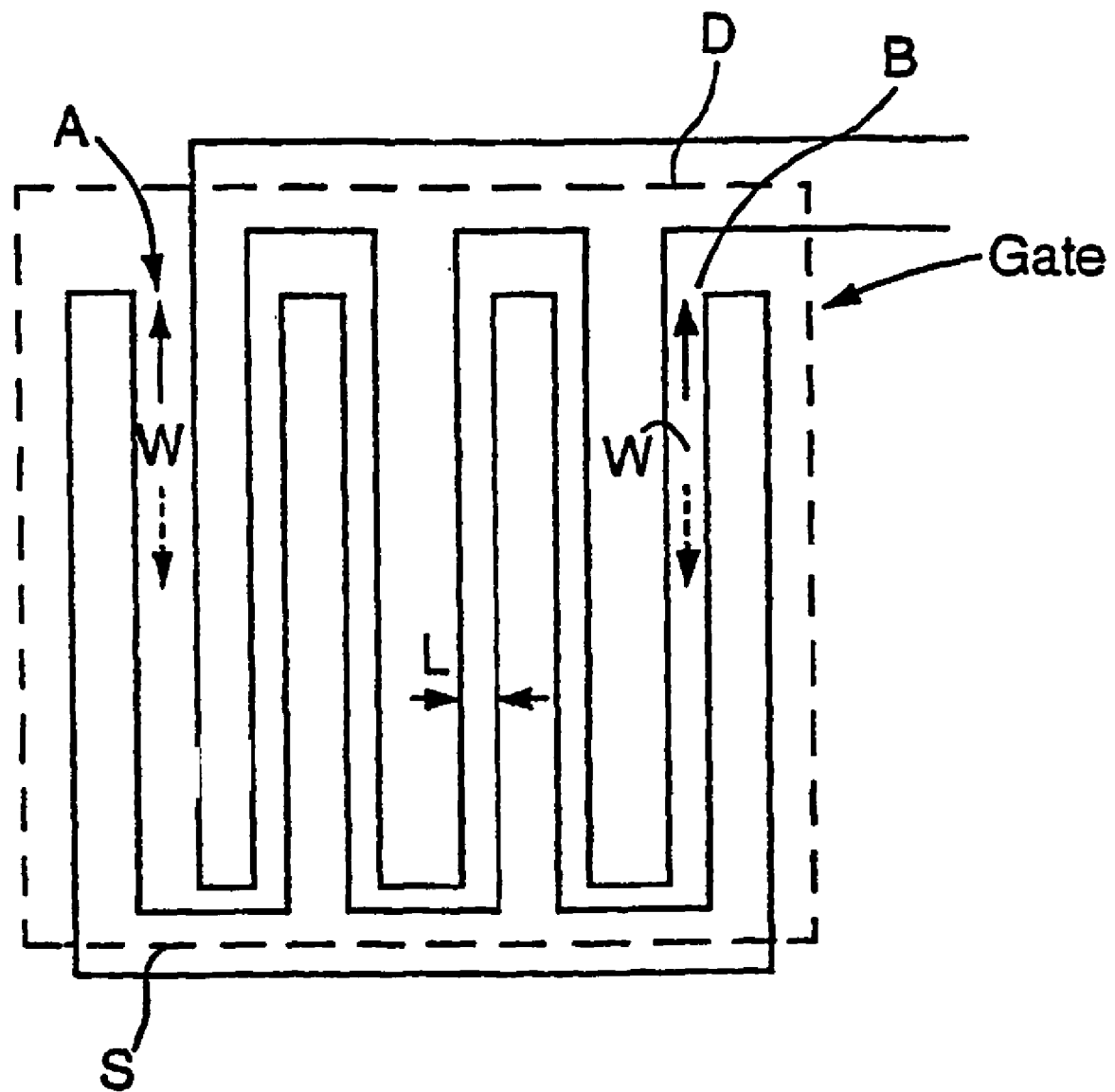
FIG. 9 shows schematically a channel region of a thin film transistor obtained by using interdigitated source and drain electrodes.

Hence, in a preferred form of the invention the source and drain electrodes 36, 38 are fabricated as comb-like interdigitated regions, as shown in FIG. 7. In essence, the channel length is provided by the spacing between the comb-like regions and the channel width is provided by the entire length of the spacing between the interdigitated regions; shown respectively as L and W in FIG. 9. By fabricating the source and drain regions as shown in FIG. 9 through the use of a lithographic technique, a channel length of less than 1 micron, the width of source/drain electrodes of less than 1 micron and a channel width of in excess of several hundred microns can be provided, enabling a soluble organic semiconductor transistor with a fast switching speed and a high drain current capability to be provided.

Figure 10:
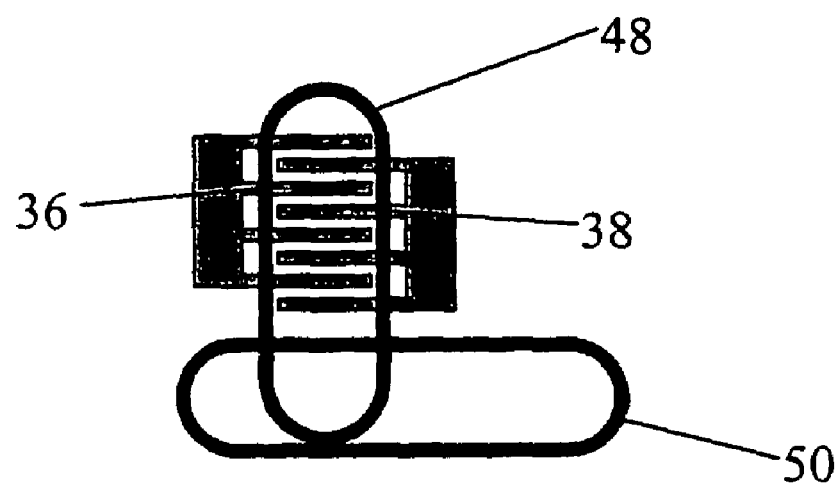
FIG. 10 shows schematically an enlarged view of the conductor regions illustrated in FIG. 9.

The line width of the printed gate electrodes 48 is shown more clearly in FIG. 10. For clarity, in FIG. 10 the printed gate electrodes are shown in outline so that the spatial relationship with the interdigitated source and drain regions can be clearly seen. The printed gate electrodes 48 are printed such that they have a width which covers the interdigitated fingers of the comb-like source and drain electrodes so as to completely overlie the channel region, as shown in FIG. 10.

Figure 11:
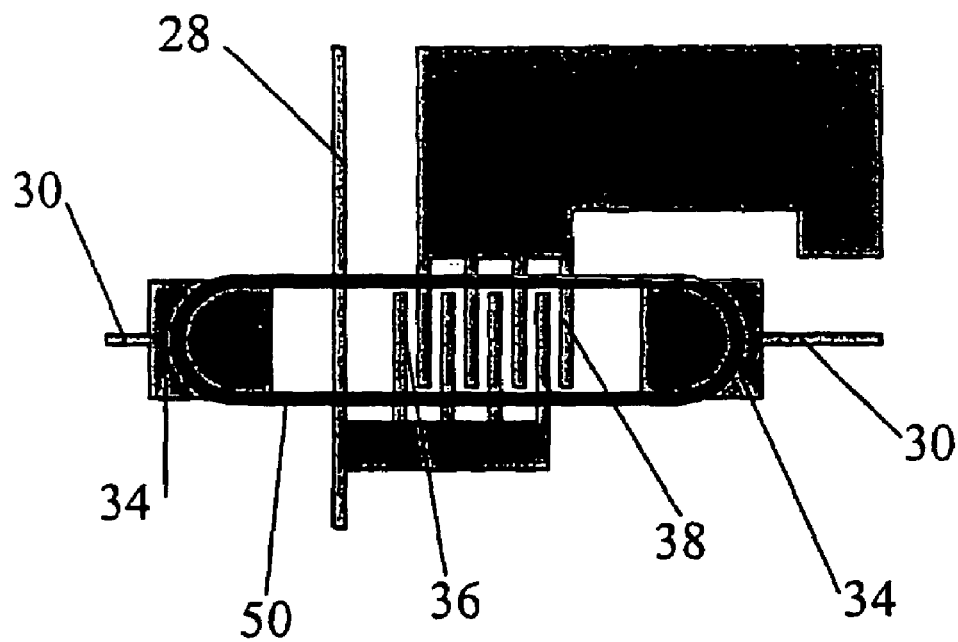
FIG. 11 shows an alternative arrangement for interdigitated source and drain electrodes arranged between strip-like segments of the conductor layer after patterning.

The overlap length (interdigitisation) of the comb teeth may be chosen to be slightly smaller length than the line width of the printed gate electrode. With this structure, the gate capacitance is minimised even though the line width of the printed gate electrode remains large compared to the channel length L. The gate electrodes also preferably extend into contact with the conductive interconnects, which have an increase width in comparison to the strip like segments of the gate lines 30 to ensure that good electrical contact is provided between the gate lines and the gate electrodes. Source and drain electrodes may be located in the path of the gate line 30, in which case the conductive interconnects 50 can also act as gate electrodes, as seen in FIG. 11. In this configuration, the inkjet printing procedure for printing gate electrodes can be simplified and is therefore more efficient.

Figure 6:
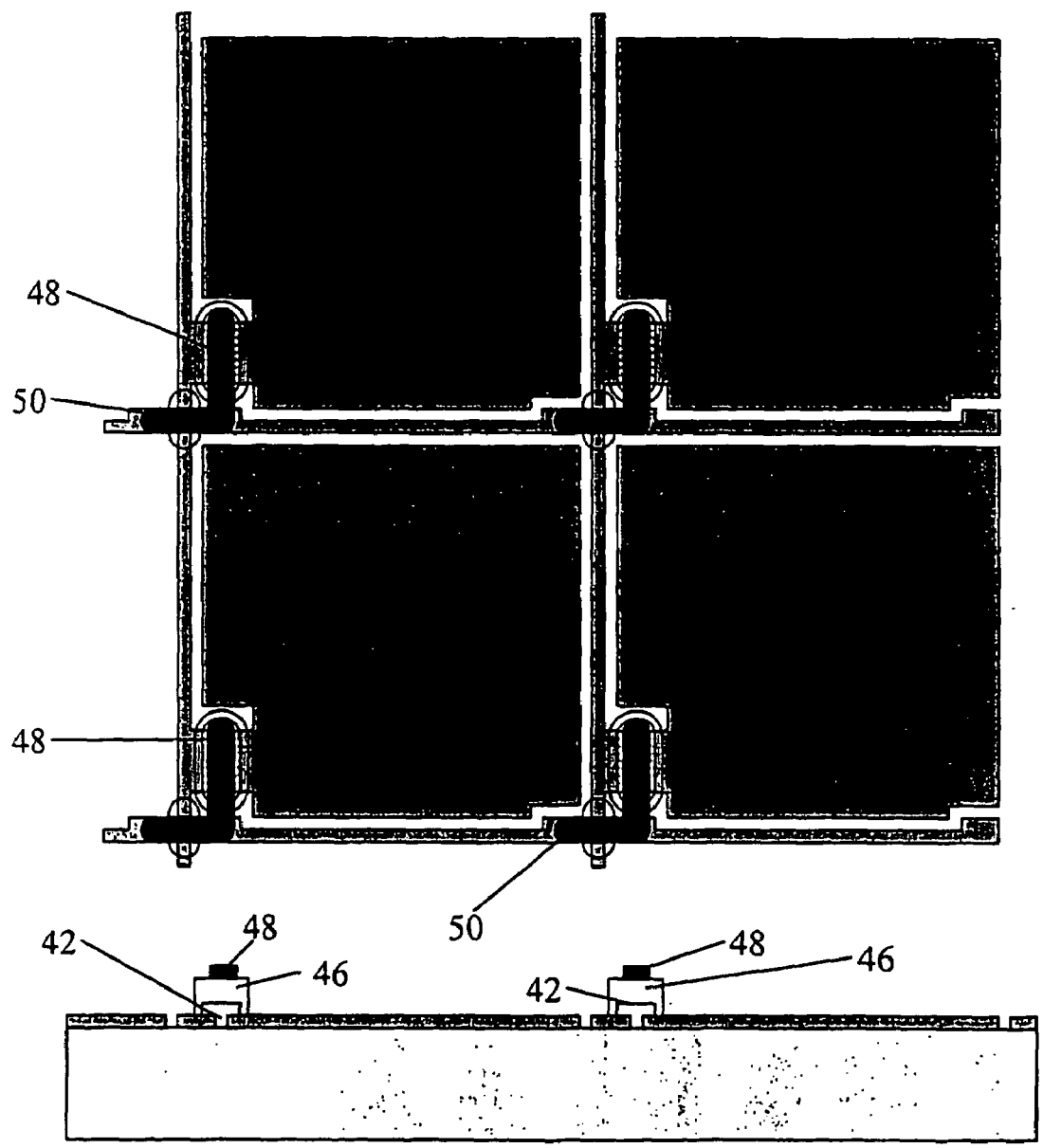
FIG. 6 shows conductor regions deposited onto the structure illustrated in FIG. 5 using an inkjet printing technique.

The structures shown in FIGS. 6 and 7 can each serve as an active matrix addressing scheme for a liquid crystal display with a TFT located adjacent to each pixel of the display. The method of the present invention can however also be used to provide, for example, two or more TFTs at each pixel electrode so that the addressing scheme can be used for displays having current driven display devices, such as organic polymer electroluminescent display devices.

In the embodiment described above, the patterned layer 26 is fabricated from a single layer inorganic conductor film 20 deposited onto the substrate 22 and patterned by a lithographic process.

Some inorganic conductor materials exhibits a smaller work function than the highest occupied molecular orbital (HOMO) level of organic semiconductors. Indium tin oxide (ITO), for example, has a work function of between 4.0 eV and 4.5 eV depending on process conditions, and F8T2 exhibits a HOMO level of about 5.5 eV. Hence, the energy gap which must be overcome by the energy carriers for injection of the energy carriers from the inorganic conductor material to the organic semiconductor material is relatively high and, therefore, injection of the energy carriers is hindered, reducing device efficiency. Conductive polymers, such as PEDOT or polyanilene have a HOMO level of about −4.6 eV to about −5.3 eV, which is between the energy levels of the inorganic conductors and the organic semiconductor materials. Therefore, if the patterned layer is provided as a bi-layer structure comprising of a first layer of the inorganic conductor material and a second layer comprising of a conductive organic polymer, then injection of the energy carriers into the organic semiconductor polymer can be improved and accordingly, the operational efficiency of the organic semiconductor polymer can also be improved whilst benefiting from the use of the higher electrical conductivity inorganic conductive material for the patterned layer 26.

Hence, all or part of the patterned layer 26 may be provided in the form of such a bi-layer structure and this may continue to be provided by the use of a single lithographic process. A uniform bi-layer can be etched simultaneously in a single lithographic process. This can be achieved using a self-aligning approach whereby the layer of organic conductor material is coated over the patterned layer 26 of inorganic material and then exposed through the substrate and the patterned inorganic layer.

The method of the present invention can be used to fabricate any form of thin film circuit and FIGS. 12 to 16 illustrate, as an example, the method of the present invention when used to fabricate a logic circuit (a set-reset flip-flop) having two intercoupled NAND circuits with printed transistors and printed resistor circuit elements.

Figure 12:
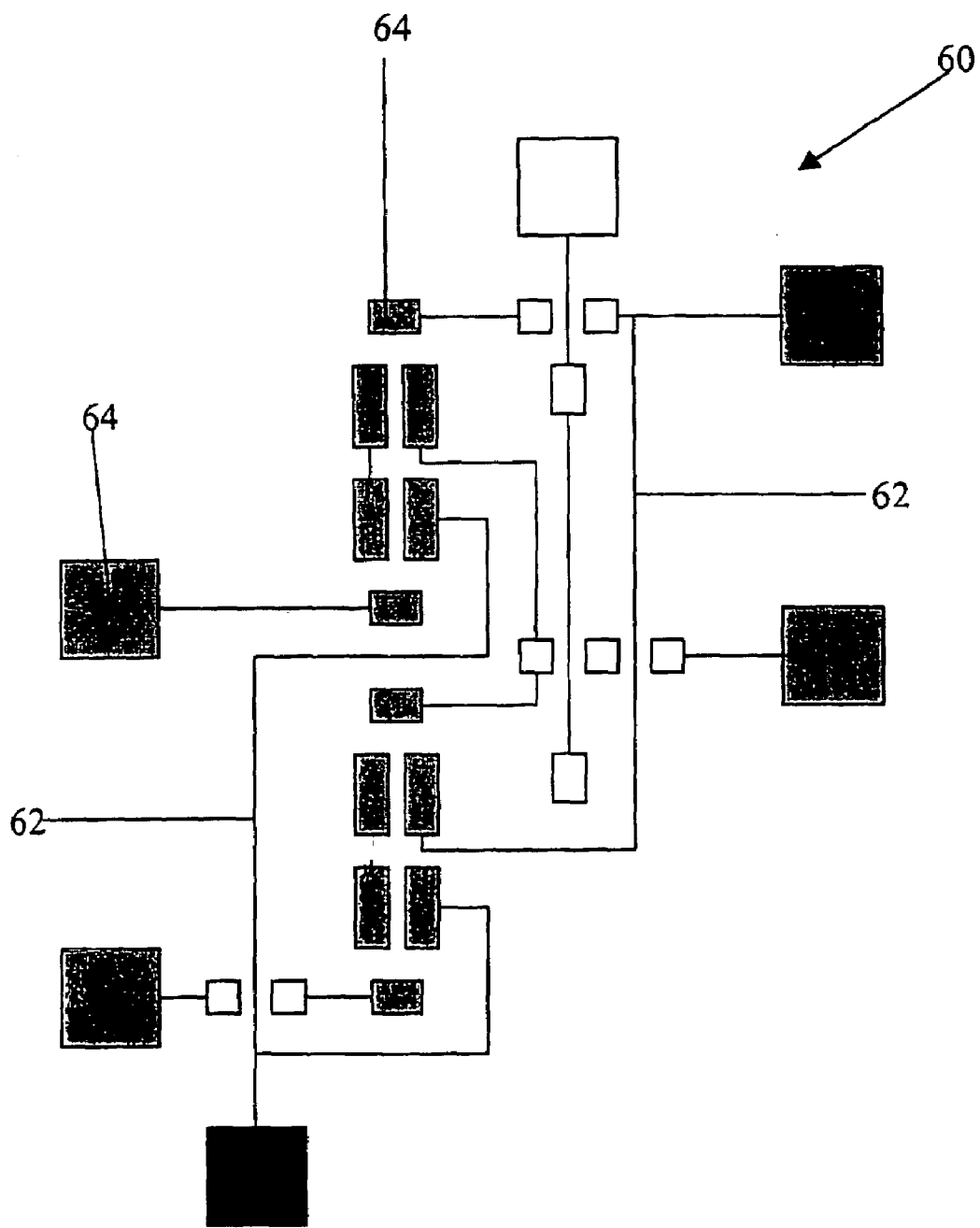
FIG. 12 shows an arrangement of discrete areas of a patterned layer patterning accordance with the method of the present invention.
Figure 13:
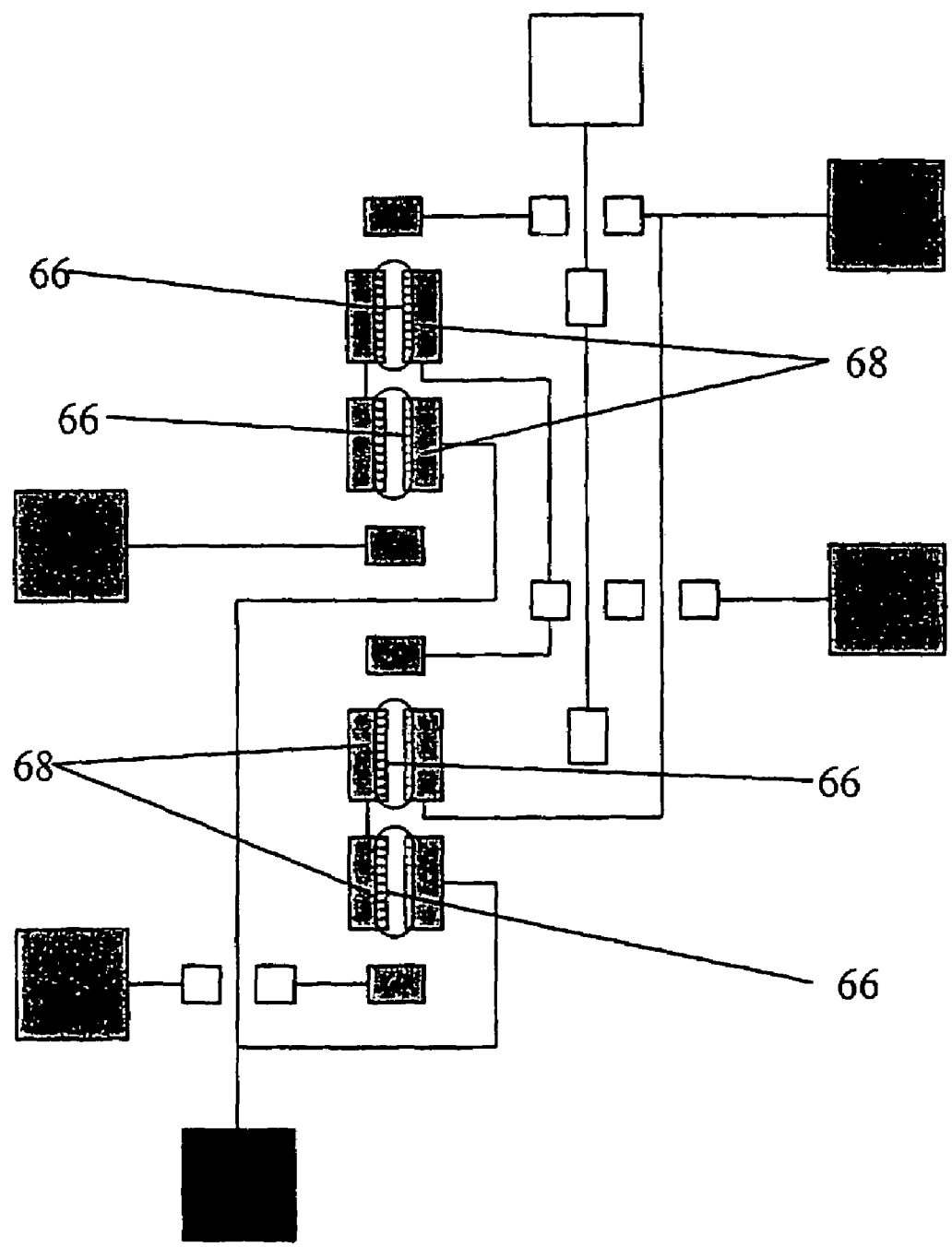
FIG. 13 shows semiconductor regions deposited onto the patterned layer illustrated in FIG. 12 using an inkjet printing technique in accordance with the method of the present invention.
Figure 14:
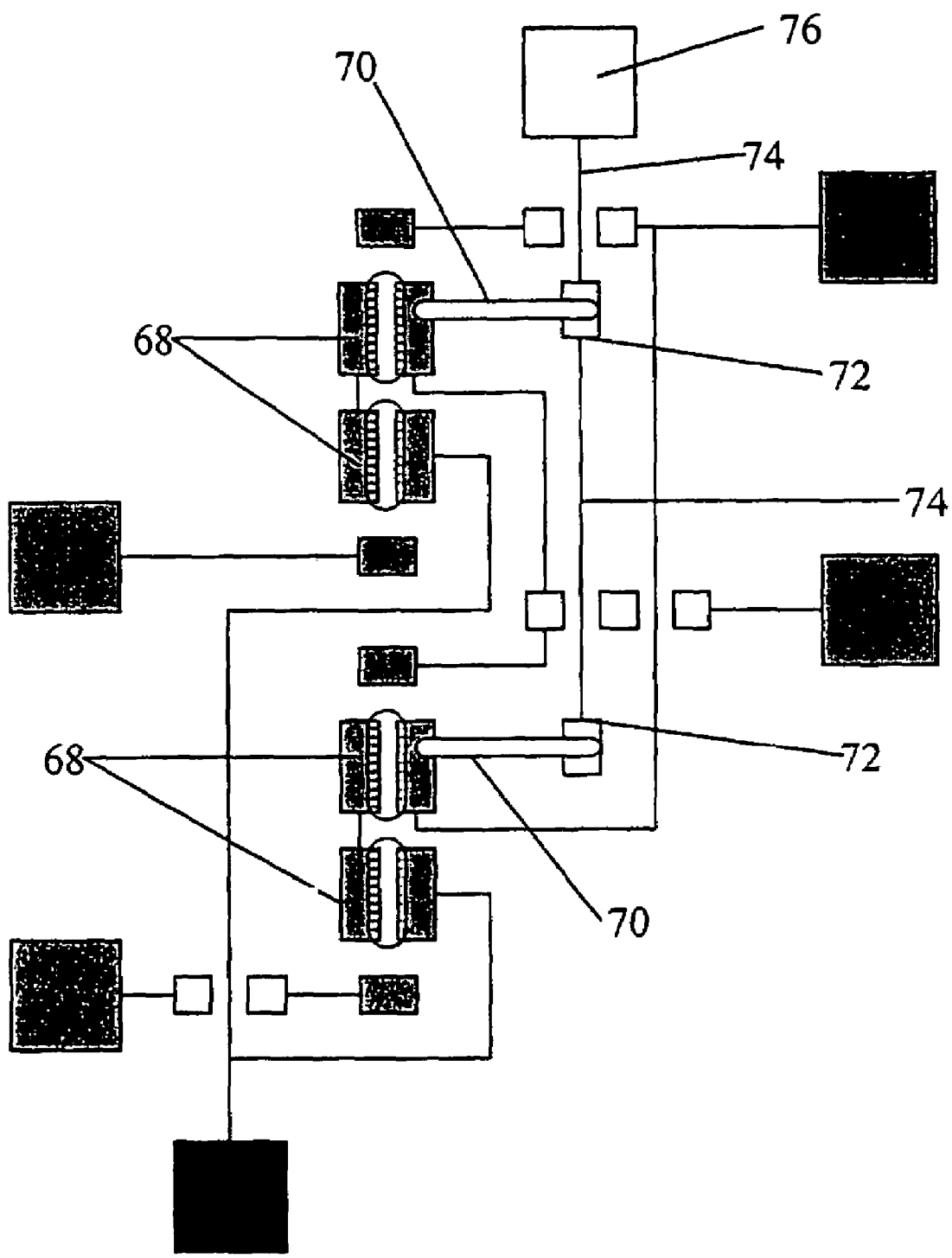
FIG. 14 shows resistive elements deposited onto the structure illustrated in FIG. 13 using an inkjet printing technique in accordance with the method of the present invention.

Referring to FIG. 12, a patterned layer 60 having discrete areas of patterned conductors 62 and electrodes 64 are fabricated on a substrate using a lithographic technique. Areas 66 of semiconductor material are then deposited at localised regions by an inkjet printing technique so as to contact electrodes 68 of the patterned layer 60, which are to serve as source and drain electrodes for four TFTs to be connected to provide the two NAND gates. This structure is shown in FIG. 13. To fabricate load resistors, areas 70 of a resistive material are then deposited at localised regions, preferably using an inkjet technique, so as to extend between two of the electrodes 68 and further electrodes 72. The resistive material may comprise a polymer material, such as a mixture of PEDOT and an insulating polymer, or a colloid in solution. The further electrodes 72 are connected by conductive strips 74 of the patterned layer 60 to a voltage supply electrode 76 for the logic circuit to which a supply voltage $V_{dd}$ may be applied. This provides the structure shown in FIG. 14.

Figure 15:
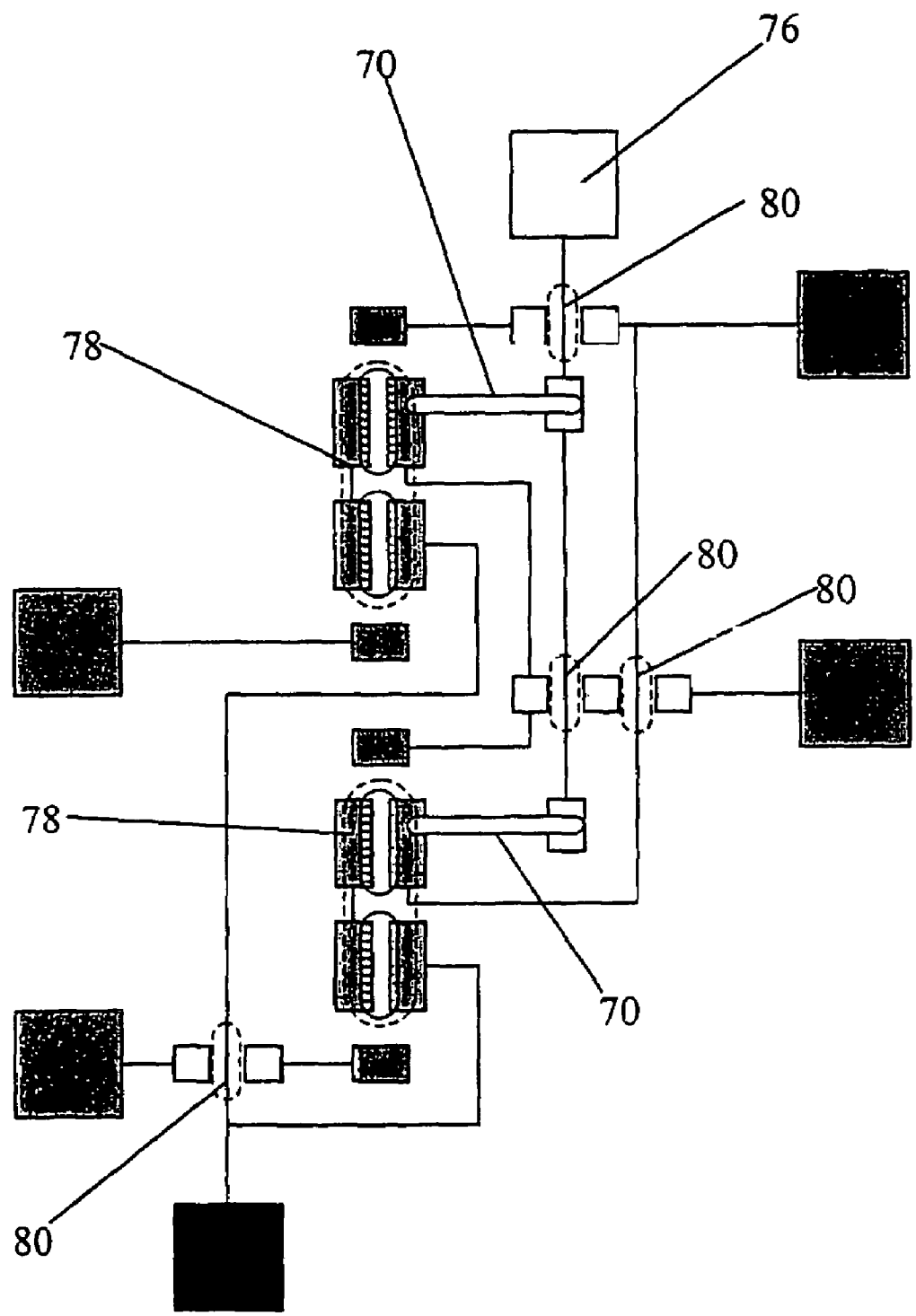
FIG. 15 shows insulator regions deposited onto the structure illustrated in FIG. 14 using an inkjet printing technique in accordance with the method of the present invention.
Figure 16:
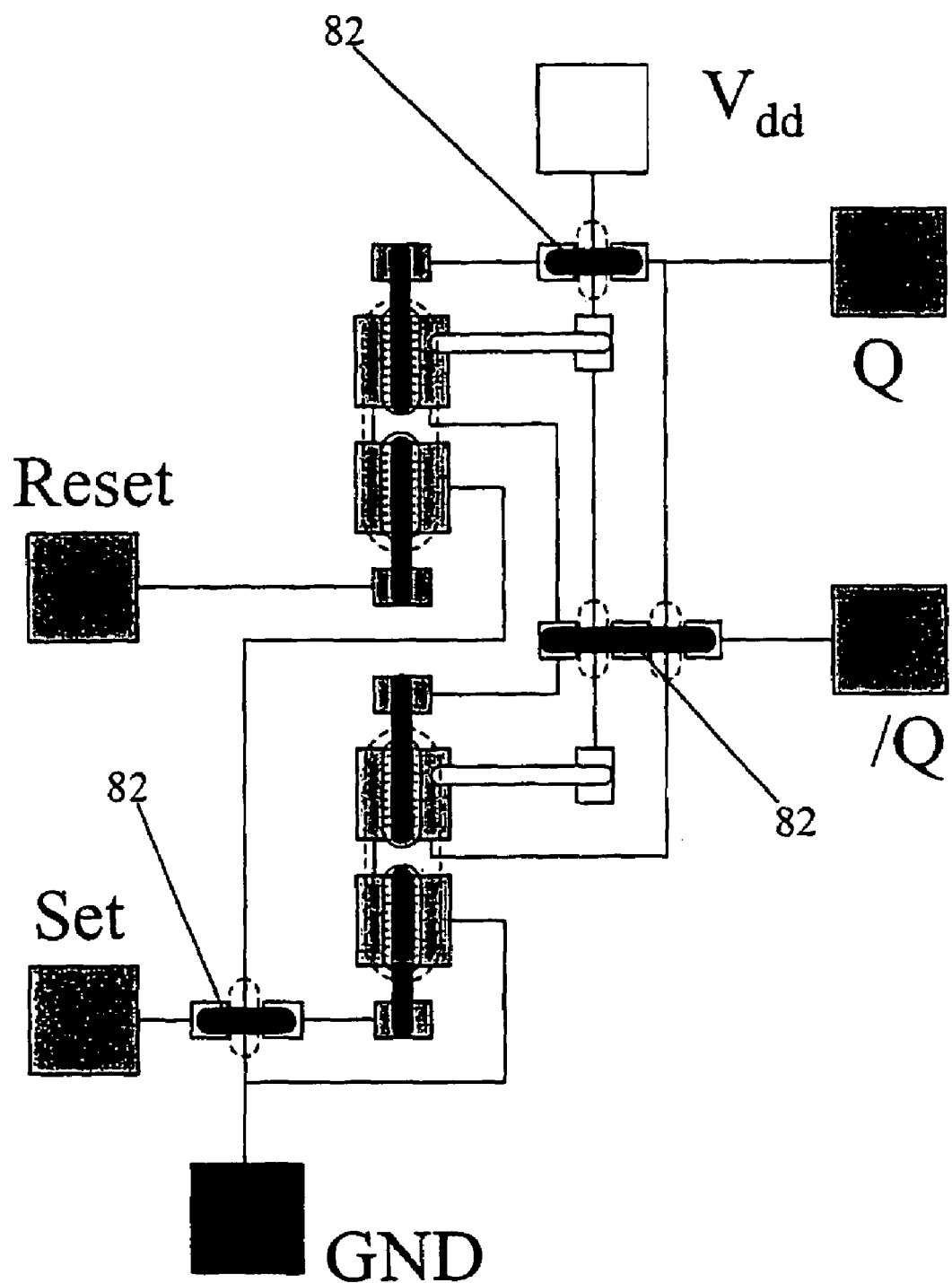
FIG. 16 shows conductor regions deposited onto the structure illustrated in FIG. 14 using an inkjet printing technique in accordance with the method of the present invention.

An insulator material is then deposited at localised regions to provide gate dielectric areas 78 over the semiconductor areas 66 and insulator areas 80 over selected conductive strips of the patterned layer 60, as shown in FIG. 15. The insulator areas 80 serve to isolate the selected conductive strips at the cross-over points with the paths of other conductive strips used to provide interconnects in the logic circuit. Areas 82 of a conductive material are then deposited by an inkjet printing technique to provide conductive interconnects over the insulator areas 80 to complete the circuit, as shown in FIG. 16.

Figure 17:
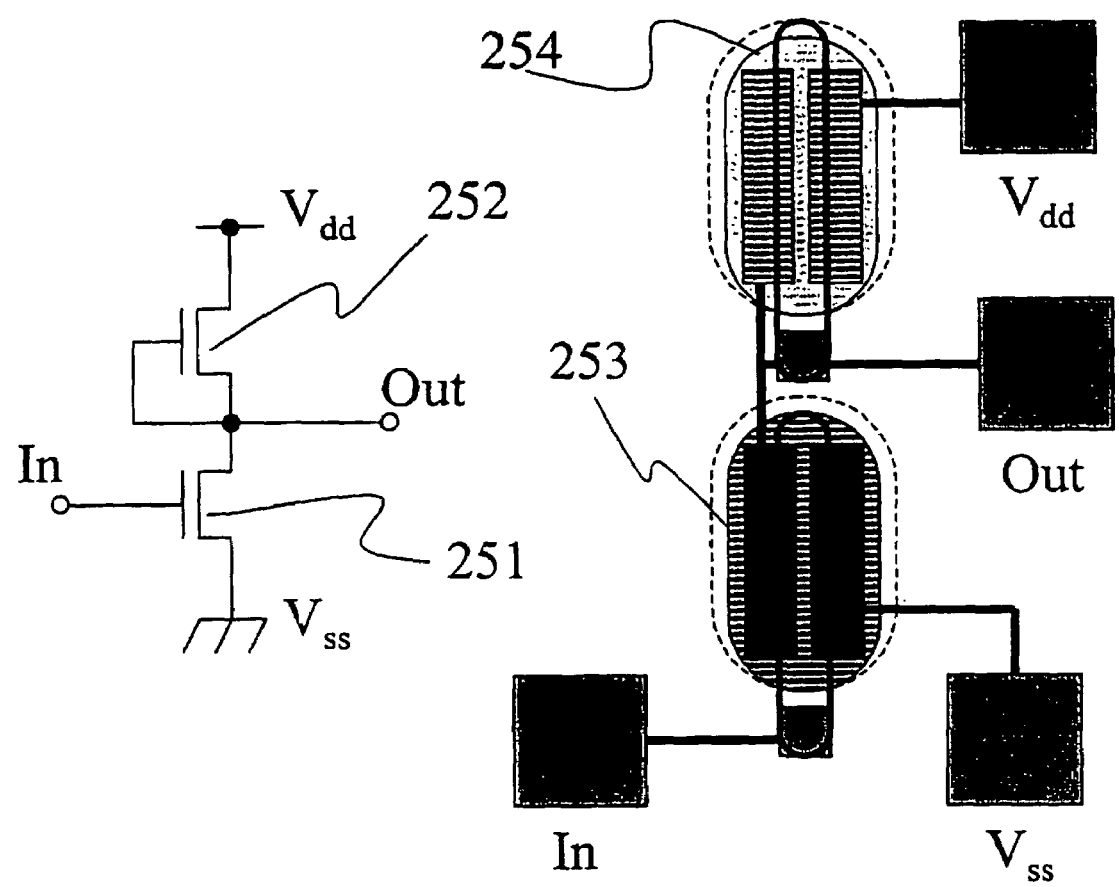
FIG. 17 shows an alternative embodiment for providing resistive elements in the form of depletion type load transistors.

In the embodiment shown, the load resistors 70 are applied to obtain logic gates. However, the use of load transistors is also possible. An example of a depletion-type transistor suitable for this purpose is shown in FIG. 17. Enhancement and depletion type characteristics are desirable for the switching transistor 251 and the load transistor 252, respectively. Intrinsic semiconductor material 253 is used in the enhancement type switching transistor 251, and doped semiconductor material 254 in the depletion type load transistor 252, and these semiconductor materials are deposited by inkjet printing. Deposition of these different materials in the same circuit can be achieved by inkjet printing without a large increase of costs. Therefore, this invention is especially suited to fabricate integrated circuits which incorporate different semiconductors.

Figure 18:
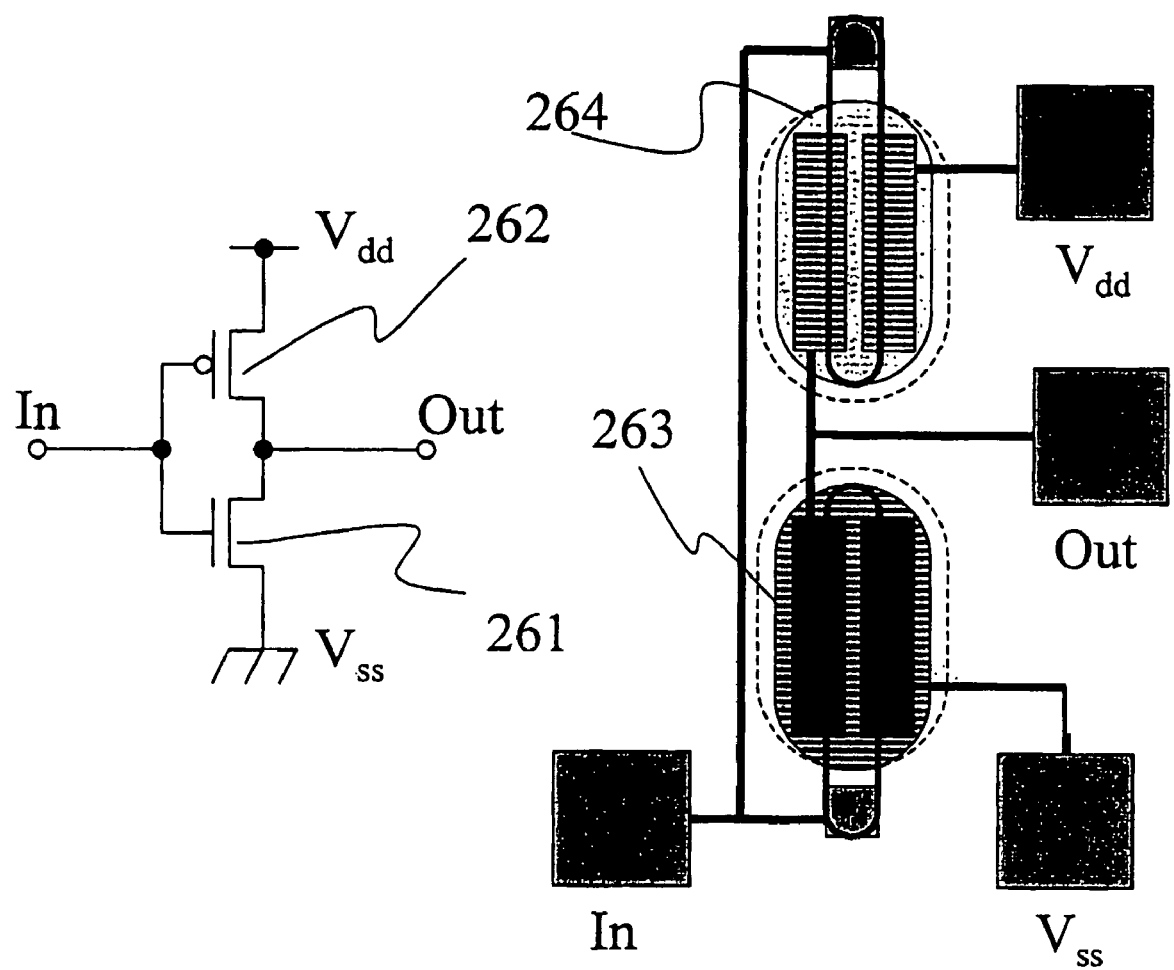
FIG. 18 shows a complementary logic circuit fabricated in accordance with the method of the present invention.

The same thing is also true in the case of a complimentary logic circuit as shown in FIG. 18. An n-type transistor 261 and a p-type transistor 262 can be fabricated by depositing n-type semiconductor 263 and p-type semiconductor 264 materials, respectively, by inkjet printing.

It should be noted that interdigitated source and drain electrodes can be used in any of the logic circuits of FIGS. 12 to 18. Interdigitated source and drain electrodes are especially beneficial in logic circuits to enable operation at high frequency, because the small overlap area of gate-source(drain) provided by the interdigitated electrodes can minimise the gate capacitance, and it is the gate capacitance which causes a pulse delay in logic signals. Such an electrode configuration can be easily fabricated using the method of the present invention.

The logic circuits described above can be fabricated as large scale logic arrays and these may be used to supply the requisite signals to the data lines 28 and gate lines 30 of the active matrix addressing schemes described with reference to FIGS. 6 to 8. Furthermore, the large scale logic arrays can easily be formed on the same substrate (which may be of plastics material) as that used for the addressing scheme. Hence, the conductor film 20, when patterned to provide the patterned layer 26 can, during the same patterning step using the lithographic technique, be patterned to provide the conductors 62 and electrodes 64 for the large scale logic arrays together with any interconnects required between the logic arrays and the gate and data lines of the active matrix addressing scheme. The TFTs of the logic arrays and the addressing scheme, and any resistive elements, whether in the form of load resistors or load transistors, can then be provided using the inkjet printing technique, using a variety of semiconductor materials selected for the TFT function within the circuit, providing a very efficient and therefore cost effective fabrication technique. Furthermore, the TFTs can be fabricated from cost efficient semiconductor polymers and, because the channel dimensions, the gate capacitance and the gate dielectric material can be optimised easily, efficient high speed TFTs can be produced.

Moreover, the process for providing the insulator bridges at crossover points of crossing conductor paths can also be extended to the interconnects between the logic arrays and the display addressing scheme, enhancing design freedom.

It can be appreciated, therefore, that significant benefits accrue from the method of the present invention and these can be applied with particular advantage when a plastic substrate is used, as the attendant registration difficulties associated with the use of these substrate materials can easily be accommodated.

Figure 19:
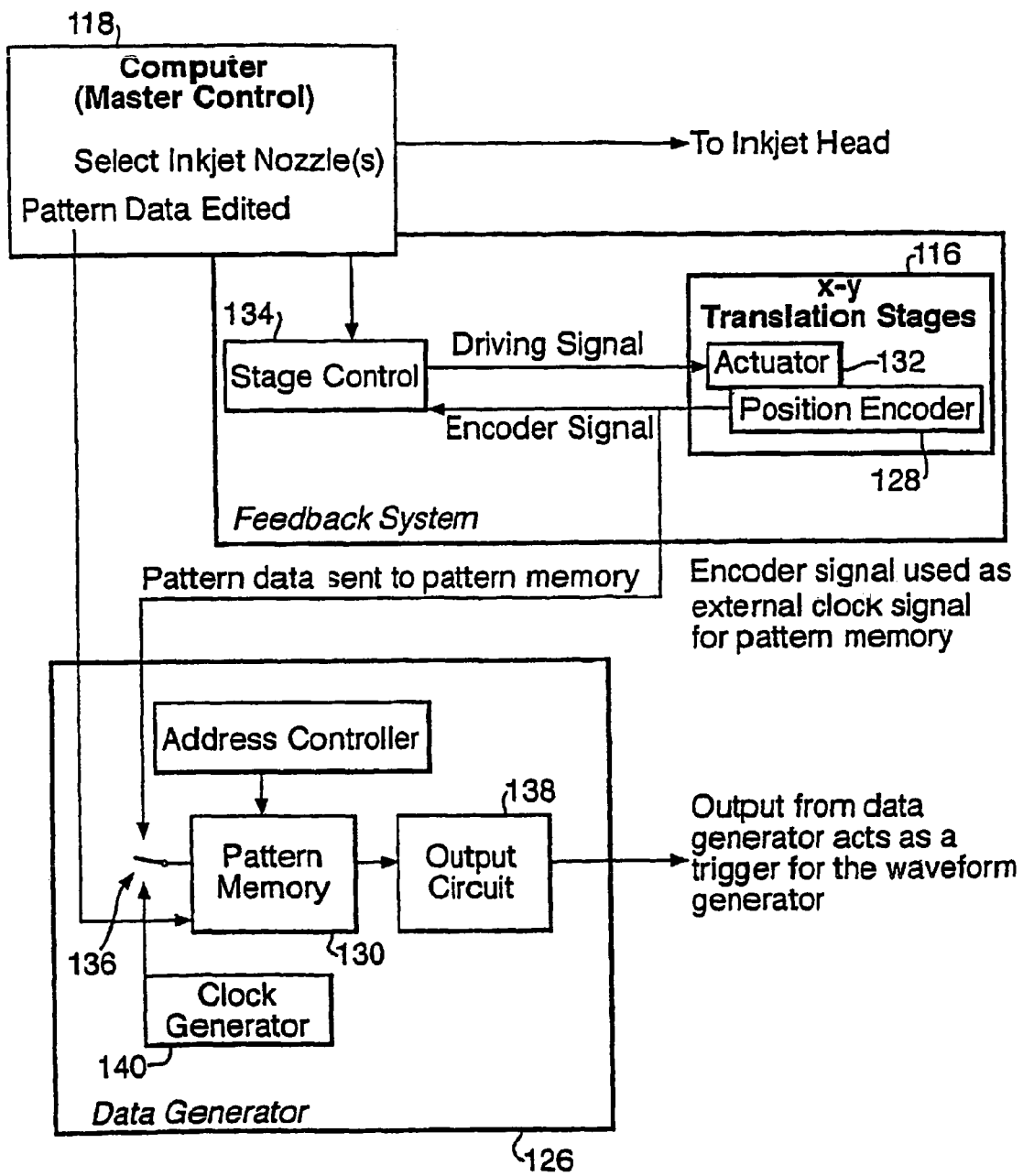
FIG. 19 is a schematic block diagram of a control system for an inkjet deposition apparatus for use in the method of the present invention.

The inkjet printing techniques of the present invention can be carried out to advantage by using an inkjet printing head having active feedback control of the positioning of the inkjet head relative to the substrate. This is because the inkjet printing technique is used to deposit a variety of materials at the localised regions over the substrate, and by the use of such a feedback control system continuous inkjet printing of the semiconductor, insulator and conductor materials can be achieved. Such a system is illustrated in FIG. 19.

A computer 118 provides master control of the system and nozzle selection signals are provided to the inkjet head to select those nozzles from which ejection of the material for printing is to occur. The inkjet deposition apparatus also includes a waveform generator (not shown in FIG. 19) for supplying the driving pulses to the inkjet head.

The waveform generator is driven by a data generator 126 and is not driven directly from the computer 118. The data generator 126 is arranged to receive an encoder signal from a position encoder 128 which is incorporated into the motorised translation stage 116. The encoder signal from the position encoder 128 is used as an external clock signal for a pattern memory 130 of the data generator 126. Hence, the inkjet apparatus provides synchronisation between the motion of the translation stage 116 and the pattern data held in the pattern memory. The frequency at which the inkjet head is driven by the driving pulses from the waveform generator is therefore determined by the velocity of the translation stage 116.

The computer 118 is programmed with the pattern data of the device to be printed. In operation of the apparatus, the pattern data is sent by the computer 118 to the data generator 126, where it is stored in the pattern memory 130. The nozzles to be used for printing of the pattern are then selected by the computer 118 by the provision of the nozzle selection signals to the inkjet head. The computer 118 also provides a motion command or driving signal to an actuator 132 in the translation stage 116 via a stage control circuit 134 which causes the translation stage to move to the desired coordinates in relation to the nozzles of the inkjet head as required by the pattern data.

The translation stage, however, includes the position encoder 128, which may for example be an optical or a magnetic encoder, which provides an encoder signal that is fed to the stage control circuit 134 and the data generator 126. By using the encoder signal in a feedback system to the stage control circuit, the driving signal fed to the translation stage can be controlled to ensure that the translation stage 116 is moved relative to the print head with the required velocity and to the required coordinates. Hence, the system is able to compensate for any periodic fluctuations that may be present in the lead screw used to effect motion to the translation stage 116.

The encoder signal is also fed to the pattern memory 130 of the data generator 126 via a switch 136 where it acts as a clock signal for the pattern memory. In this manner, the output signal from the data generator 126, which acts as a trigger signal for the waveform generator, is synchronised with the actual motion of the translation stage 116. Hence, the provision of the drive signals from the waveform generator, which cause the ejection of droplets of the material to be printed from the nozzles of the inkjet head, are controlled in dependence upon the position of the translation stage 116.

The translation stage is programmed by the computer 118 with position coordinates for the pattern, required acceleration and velocity of movement and the data generator 126 is actually clocked when the translation stage moves through the provision of the encoder signal from the position encoder 128. Thus, printing of the electronic device on the substrate can be made at any time, including when the translation stage 116 is accelerating, decelerating or moving at constant speed, thereby decreasing significantly the time required to fabricate the electronic device on the substrate.

Furthermore, because the pattern memory 130 is synchronised with the movement of the translation stage 116, extremely accurate printing of the required pattern can be achieved since the ejection of the material for printing from the inkjet head is controlled by the actual position of the translation stage 116, as sensed by the position encoder 128, and not by a time based system as is the case with independent waveform triggering types of inkjet deposition apparatus. Preferably, the position encoder 128 provides encoder signals having a frequency such that the pattern memory 130 is clocked with a cycle corresponding to 0.2 microns of travel of the translation stage 116.

Figure 20:
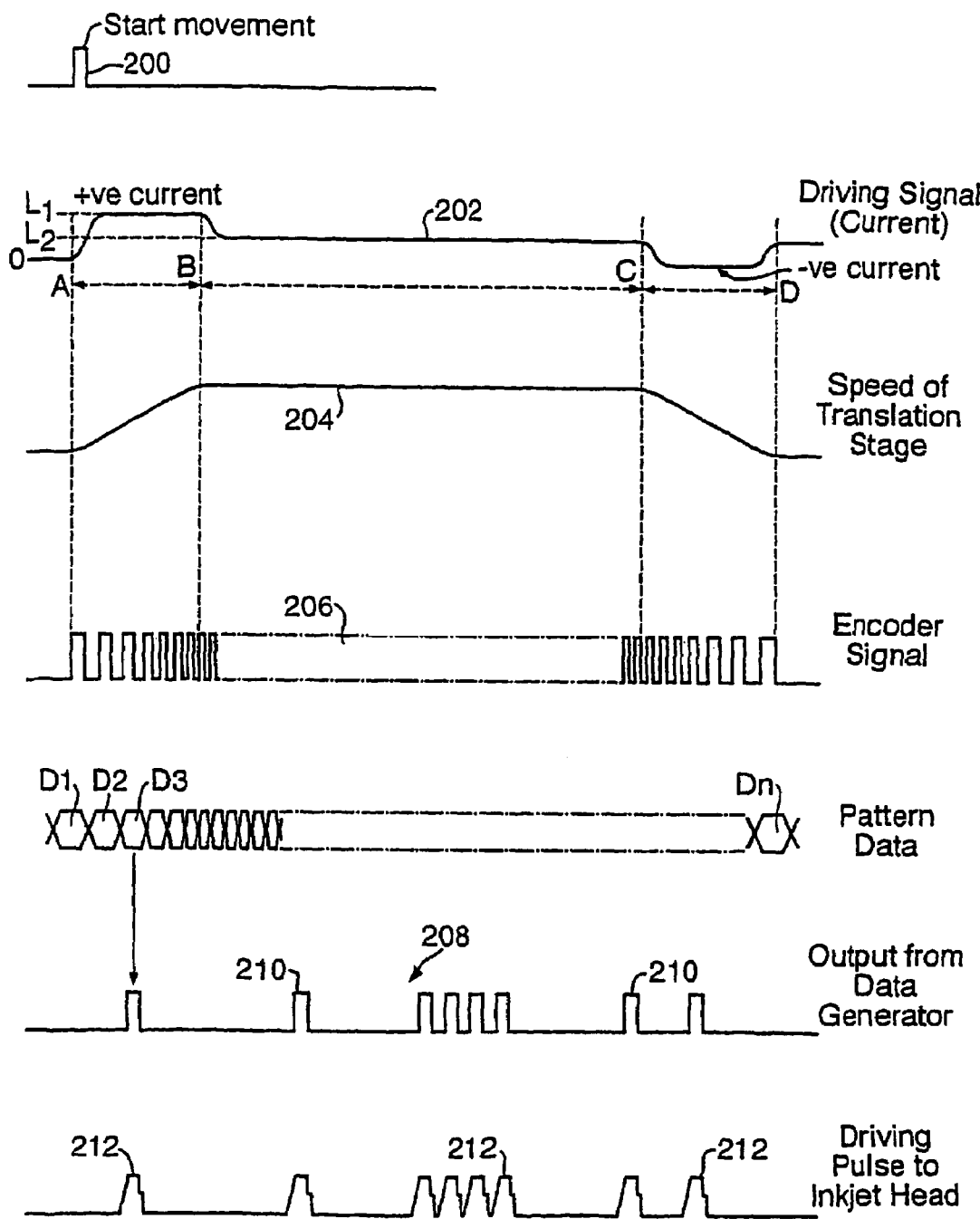
FIG. 20 shows waveform diagrams for the control system illustrated in FIG. 19.

The signal timing for operation of the inkjet apparatus can be seen in FIG. 20. Movement of the translation stage 116 is started by the provision by the computer 118 of a start movement trigger pulse 200 to the stage control 134. Upon receipt of the pulse 200 the stage control 134 provides a current based driving signal 202 to the actuator 132 of the translation stage 116. The driving signal 202 is arranged to ramp up quickly from zero to a level $L_1$ and this level $L_1$ is held for a short period of time so as to provide rapid acceleration of the translation stage 116. The driving signal 202 is then reduced from level $L_1$ to a reduced level, shown as level $L_2$ in FIG. 20, to provide a constant velocity to the translation stage. The level $L_2$ of the driving signal is maintained until a negative current, shown as level $L_3$ in FIG. 20, is applied to the actuator so as to rapidly decelerate the translation stage 116. Hence, over a translation cycle, the translation stage 116 is accelerated during the period A to B, maintains a steady velocity during the period B to C and is decelerated during the period C to D. The velocity of the translation stage is therefore as shown by plot 204 of FIG. 20.

The output signal of the position encoder is shown as encoder signal 206 in FIG. 20 and is in the form of a square wave pulse train. It can be seen from the signal 206 that the frequency of the pulse train is proportional to the velocity of the translation stage. Hence, as the translation stage is accelerated during the period A to B, the encoder signal 206 increases in frequency to reach a steady state pulse repetition frequency which is maintained during the period B to C, when the translation stage is moved at a steady state constant velocity, and reduces in frequency during the deceleration period C to D of the translation stage 116. Hence, each pulse of the encoder signal represents a fixed amount of movement of the translation stage; 0.2 microns in the embodiment described.

The pattern data is also shown in FIG. 20, where the areas D1 to Dn represent schematically the localised regions at which the materials are to be deposited by the method of the present invention. During printing the switch 136 of the data generator is arranged so that the encoder signal from the position encoder 128 is input to the pattern memory 130. The pattern data stored in the pattern memory may require, for example, the area D3 to be printed during the period A to B during which the translation stage is being accelerated and therefore not moving at a constant speed. For each 0.2 microns of movement of the translation stage 116, the position encoder 128 provides an encoder signal in the form of one of the pulses of the pulse train 206 shown in FIG. 20. Area D3 corresponds to the third pulse of the pulse train 206 from the position encoder 128; namely, at the time when the translation stage has moved through 0.6 microns from its initial rest position. This third pulse from the position encoder acts as a clock pulse for the pattern memory 130, which provides an output signal from the data generator 126 via an output circuit 138. Each time the pattern data requires one of the areas D1 to Dn to be printed, such an output signal is provided from the data generator 126 to act as a trigger for the waveform generator. The output signal from the data generator 126 is therefore in the form of a pulse train 208, with the spacing between pulses 210 of the pulse train being determined by the pattern data stored in the pattern memory and the pulses of the encoder signal 206 output from the position encoder 128, which trigger the data generator to output the pulses 210.

The pulses 210 from the data generator are fed to and act as trigger pulses for the waveform generator, which provides a driving pulse 212 to the inkjet print head each time that a pulse 210 is received. It can be seen therefore from the waveform and timing diagrams shown in FIG. 20 that the provision of the driving pulses 212 to the inkjet head, which cause the ejection of the droplets of material to be printed from the head, is synchronised with the speed of the translation stage 116. Hence, irrespective of whether the translation stage is accelerating, decelerating or moving at a constant speed, the droplets of material to be printed are ejected at the correct co-ordinates onto the substrate. This is also the case when a variation in the speed of the translation stage takes place, such as may occur as a result of a periodic variation in the pitch of the lead screw used to physically drive the translation stage 116.

During or between printing of devices by the inkjet apparatus shown in FIG. 19, there may be periods of time when the inkjet head is not used for actually printing of a device and the inkjet head is then positioned at an idling position outside of the device area on the substrate. However, to prevent clogging of the nozzles of the inkjet head during these idling periods it is necessary to periodically eject material from the nozzles of the inkjet head. During such idling periods, the translation stage is stationary and hence an encoder signal from the position encoder 128 is not present to use as a clock pulse for the pattern memory 130. Hence, there is no output signal from the data generator and the waveform generator does not therefore provide the driving pulses to the inkjet print head.

Therefore, upon commencement of an idling period the switch 136 is operated to couple a clock generator 140 to the pattern memory. The clock generator produces a stream of clock pulses which substitute for the encoder signals provided during translation of the translation stage 116. Hence, the pattern generator outputs a stream of trigger pulses to the waveform generator in synchronism with the clock pulses from the clock generator 140. Clogging of the nozzles of the inkjet head during the idling periods is therefore avoided.

The translation stage 116 can move the substrate in both an X and a Y axis relative to the inkjet head and comprises therefore respective stages with respective lead screws for the X and Y axes.

The system shown in FIG. 19 can also be used to correct for errors in the displacement of the X and Y stages. For instance, an over or under shoot of translation length of either stage can be corrected by programming the computer 118 with a correction for the co-ordinates of the circuit being printed. This error may occur in both axes X and Y, thus the new co-ordinate system is applied to cover the whole area of that circuit in both axes. Various alignment marks can be observed on a circuit, and so by programming the stages to move to these co-ordinates, it is possible to observe the error in the position of the stages over relatively large distances across the circuit. For example, along the X axis say, the stage can be programmed to move from one mark to another, and by rotation of the substrate on which the circuit is being printed it is possible to compensate for an error in the position of the circuit on the stage. However, the length of travel may be also be determined as being too long or too short along this axis. This error can be compensated for by programming a correction factor into the travel length command for this single axis.

Ideally, the construction angle between the axes X and Y of the translation stage must be exactly 90 degrees. But, in practice, this ideal construction angle is usually not achieved due to manufacturing tolerances. Hence, when the stages are programmed to move to a certain co-ordinate there will be an offset error. The system may also be programmed to compensate for such errors in the construction angle between the two axes. Therefore it can be seen that in view of the accuracy with which the materials may be deposited by such a feedback controlled inkjet printer, the inkjet printed areas, such as the bridges 44 isolating the very narrow data lines 32 at the cross-over points 28, can be fabricated with the required accuracy.

The method of the present invention enables therefore the fabrication of very large, flexible devices, which can only be obtained with considerable difficulty if conventional lithographic techniques are used exclusively.

The present invention is considered particularly beneficial because it is particularly suited to the use of plastics substrates: only a single photolithographic step is required which means that the problems of alignment of the multiple photolithographic masks necessarily used when multiple photolithographic steps are used, are not present.

The devices fabricated on the substrate require to be encapsulated and an inorganic passivation material, such as $SiO_2$, is preferably used for this purpose. Fluorinated polymers can also be used as a passivation layer but such organic materials are less suitable for this purpose because they are relatively permeable. However, if $SiO_2$ is used, a precursor material is required between the devices and the passivation layer. Examples of suitable materials which can be used for the passivation layer include polysilazane; monomer, dimer, tetramer, hexamer, oligomer or polymer of silicate; hydrogen silicate; ladder hydrogen silsesquioxane; and silazane.

These precursor materials can be deposited from solution in organic solvents such as methanol, ethanol, isopropyl alcohol, acetone, butyl acetate, trimethylsilanol, tetramethyl disiloxane, ethynyl dimethylchlorosilane, toluene, xylene, and trimethylbenzenes. The precursor material is usually provided as a continuous precursor layer by spin coating of a solution but the process steps for providing the $SiO_2$ passivation layer requires a process temperature in the range of at least 100° C. to 200° C. This process temperature causes heating of the precursor material, and this frequently causes shrinkage and cracking of the spin coated continuous layer. When a flexible plastics substrate is used, this is particularly problematical because the shrinkage causes the substrate to curl and, in extreme cases, cracking or breaking of the layer can occur. Hence, with the present invention the precursor material can, advantageously, also be deposited at selected locations using an inkjet technique in order to provide discrete areas of strategically positioned precursor material. Because the precursor material is not deposited as a continuous layer but as relatively small discrete areas, the surface tension in the precursor material is significantly reduced in comparison to the continuous spin coated layer. Hence, the problems associated with shrinkage and cracking of the material can be substantially alleviated, providing an improved encapsulation method. Furthermore, because the precursor material is selectively deposited as discrete areas, if required, different precursor materials in solution can be deposited at different parts of the circuit using the inkjet technique.

The method of the present invention can be preferably applied to manufacture of an electrooptical device, a semiconductor device and other electronic devices. In other words, a thin film circuit manufactured by the methods according to the present invention can be advantageously used in many forms of an electrooptical device. The electrooptical devices preferably include a liquid crystal device, an organic electroluminescent device, an inorganic electorluminescent device, a field-emission device (FED), a plasma device, an electrophoretic device, and other display devices. These devices can be preferably applied to a display apparatus. In particular, such a thin film circuit can be more preferably applied to pixel circuits and/or driver circuits formed in an active matrix substrate used in the above display devices.

Figure 21:
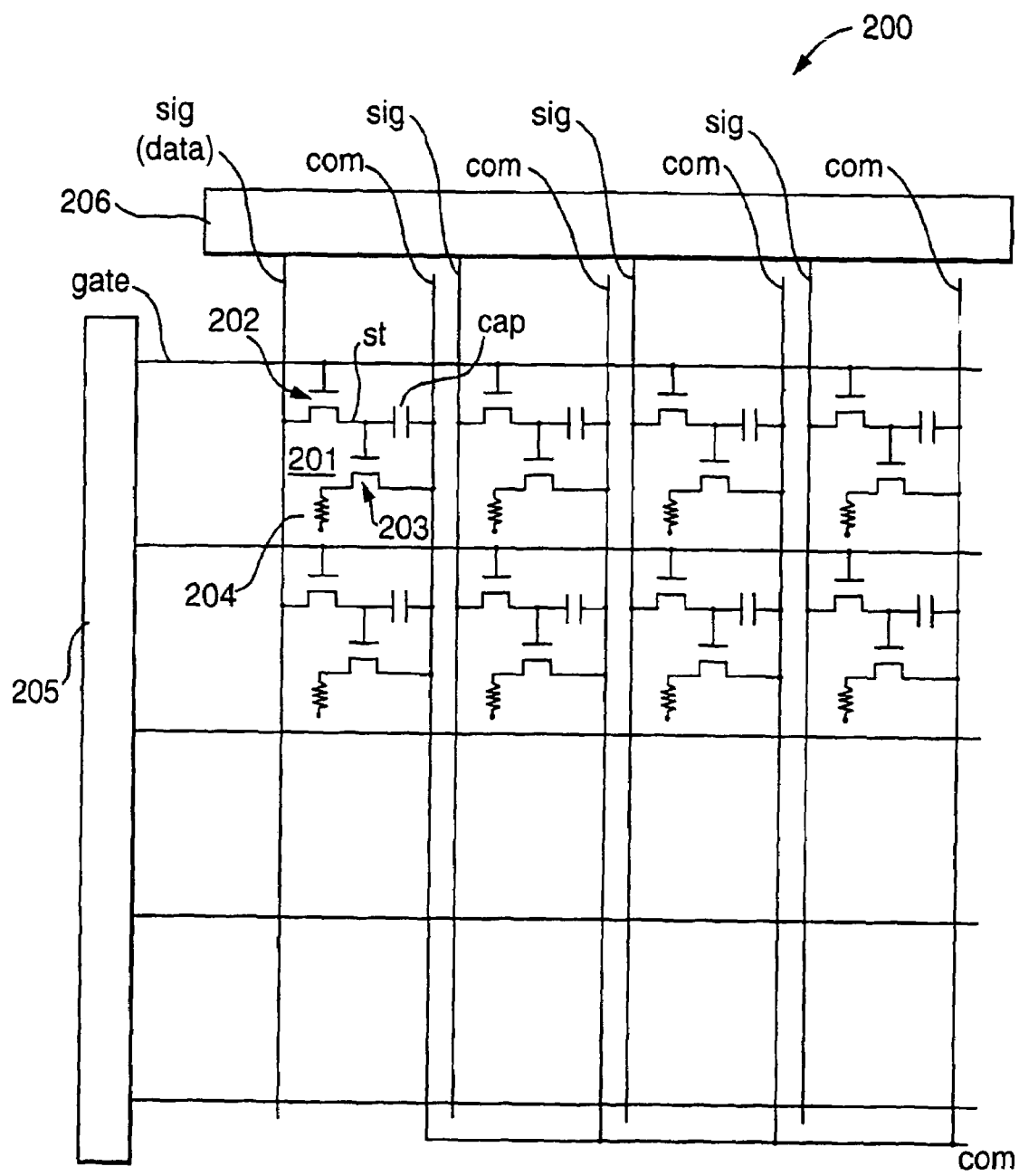
FIG. 21 shows schematically a block diagram for an electrooptical device fabricated in accordance with the method of the present invention.

FIG. 21 is a block diagram illustrating an active matrix type display device (or apparatus) incorporating electrooptical elements such as organic electroluminescent elements as an preferable example of the electrooptical devices. In the display device 200 shown in this figure, a plurality of scanning lines "gate", a plurality of data lines "sig" extending in a direction that intersects the direction in which the scanning line "gate" extend, a plurality of common power supply lines "com" extending substantially parallel to the data lines "sig", and a plurality of pixels 201 located at the intersections of the data lines "sig" and the scanning lines "gate" which are formed above a substrate.

Each pixel 201 comprises a first TFT 202 in scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electrooptical element 204 such a electroluminescent element (indicated as a resistance) into which the driving current flows from the common power supply line "com" when the element 204 is electrically connected to the common power supply line "com" through the second TFT 203. The scanning lines "gate" are connected to a first driver circuit 205 and the data lines "sig" are connected to a second driver circuit 206. At least one of the first circuit 205 and the second circuit 205 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206. Efficient fabrication of the data and gate lines in highly conductive materials can also be achieved, including isolation of the data and gate lines at mutual crossover points.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electrooptical device or display to which the TFT array(s) manufactured by the methods according to the present invention is (are) applied as noted above can be incorporated in the many types of equipment, and these can readily be provided even when a plastic substrate is used.

Various electronic apparatuses using electrooptical display devices fabricated in accordance with the present invention will now be described.

<1: Mobile Computer>

An example in which the display device fabricated in accordance with one of the above embodiments is applied to a mobile personal computer will now be described.

FIG. 22 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the present invention, as described above.

<2: Portable Phone>

Next, an example in which the display device is applied to a display section of a portable phone will be described. FIG. 23 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device according to the present invention, as described above.

<3: Digital Still Camera>

Next, a digital still camera using an OEL display device as a finder will be described. FIG. 24 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 22, the portable phone shown in FIG. 23, and the digital still camera shown in FIG. 24, include OEL element television sets, view-finder-type and monitoring-type video tape recorders, car navigation systems, pagers, electronic notebooks, portable calculators, word processors, workstations, TV telephones, point-of-sales system (POS) terminals, and devices provided with touch panels. Of course, the above OEL device can be applied not only to display sections of these electronic apparatuses but also to any other form of apparatus which incorporates a display section.

Furthermore, the display devices fabricated in accordance with the present invention are also suitable for a screen-type large area TV which is very thin, flexible and light. It is possible to paste such large area TV on a wall, or to hang on a wall. The flexible TV can be rolled up when it is not used.

The aforegoing description has been given by way of example only and it will be appreciated by a person skilled in the art that modifications can be made without departing from the scope of the present invention.

The invention claimed is:

1. A method of fabricating a circuit comprising:
    forming a first film including a conductive material and a second film including a conductive material on a substrate, the substrate provided with alignment marks for aligning an inkjet head used in an inkjet technique relative to the substrate, the forming of the first film and the second film using a lithographic technique;
    forming a third film that includes at least one of a semiconductor material and a conductive material, and that contacts the first film and the second film, the forming of the third film including a discharge of a liquid material from a nozzle equipped in an inkjet head, and a movement of the inkjet head relative to the substrate being carried out during at least a part of a period in which the forming of the third film is carried out; and
    forming a fourth film that covers at least a part of the first film, the forming of the fourth film using an inkjet technique.

2. The method according to claim 1, further comprising:
    forming a fifth film,
    the first film and the fifth film including a data line and a gate line, respectively.

3. The method according to claim 2, wherein:
    the fourth film covering at least a part of the first film and at least a part of the fifth film that is disposed at an intersection between the data line and the gate line.

4. The method according to claim 1, wherein the conductive material comprises a conjugated polymer.

5. The method according to claim 1, wherein the substrate is flexible.

6. The method according to claim 1, further comprising providing an encapsulation layer on the circuit.

7. The method according to claim 1, further comprising controlling the position of the inkjet head relative to the alignment marks using an active feedback control system.

8. A method of manufacturing an electronic device comprising the method according to claim 1.

9. A method of manufacturing an electro-optical device comprising the method according to claim 1.

10. A method of manufacturing a conductive interconnect comprising the method according to claim 1.

11. A method of fabricating a circuit comprising:
forming a first film including a conductive material and a second film including a conductive material on a substrate, the substrate provided with alignment marks for aligning an inkjet head used in an inkjet technique relative to the substrate, the forming of the first film and the second film using a lithographic technique; and
forming a third film that includes at least one of a semiconductor material and a conductive material, and that contacts the first film and the second film, the forming of the third film including a discharge of a liquid material from a nozzle equipped in an inkjet head, and a movement of the inkjet head relative to the substrate being carried out during at least a part of a period in which the forming of the third film is carried out.

12. The method according to claim 11, wherein the third film contacts the substrate.

13. The method according to claim 11, wherein:
the first film and the second film having comb-like structures: and
the first film interdigitated the second film with a space between the first film and the second film.

14. The method according to claim 13, wherein:
the interdigitated first film and second film are arranged such that comb teeth of the first film and comb teeth of the second film are interdigitated by an amount which is smaller than a width of a gate electrode, the gate electrode formed by a fifth film.

15. The method according to claim 11, further comprising controlling the position of the inkjet head relative to the alignment marks using an active feedback control system.

16. A method of fabricating a circuit comprising:
forming a first film including a conductive material and a second film including a conductive material on a substrate in a first area arranged between areas of conductive material, the forming of the first film and the second film using a lithographic technique, wherein the substrate is provided with alignment marks for aligning an inkjet head used in an inkjet technique relative to the substrate; and
forming a third film that includes at least one of a semiconductor material and a conductive material, the third film contacting the first film and the second film, the forming of the third film using an inkjet technique.

17. The method according to claim 16, wherein the first area is shaped as strips, and the areas of conductive material have strip-like segments.

18. The method according to claim 17, further comprising:
forming a fourth film including an insulating material over the third film; and
forming a gate electrode on the fourth film.

19. The method according to claim 18, wherein the forming of the gate electrode uses an inkjet technique.

20. The method according to claim 19, wherein the strips of the first area are patterned to have a portion of increased width to provide a gate electrode for a thin film transistor, the method further comprising:
using an inkjet printing technique to provide an insulator layer over the gate electrode and extending over at least that portion of the strips at a crossover point with the strip-like segments,
depositing a conductive material using an inkjet printing technique to provide a first conductive region extending over the insulator layer to electrically couple the strip-like segments, a second conductive region isolated from a first conductive region and extending over at least a portion of the insulator layer and into contact with one of the strip-like segments to provide a source electrode for the thin film transistor, and a third conductive region isolated from the first and second conductive regions and extending over at least a portion of the insulator layer and into contact with a pixel electrode to provide a drain electrode for the thin film transistor, and
depositing a semiconductor material using an inkjet technique onto an exposed region of the insulator layer overlying the gate electrode to provide a semiconductor region for the thin film transistor extending into contact with the source and drain electrodes, whereby the strips can function as gate lines, and the strip-like segments in combination with the first conductive regions can function as data lines, for an active matrix addressing scheme for a display device.

21. The method according to claim 19, wherein the first film and the second film are a source electrode and a drain electrode of a thin film transistor, respectively.

22. The method according to claim 21, wherein:
the first film and the second film are patterned to provide non-conductive buffer regions at either end of the source and drain electrodes for accommodating a difference between a resolution of the lithographic technique used to provide the source and drain electrodes and a resolution of the inkjet printing technique used to provide the third film.

23. The method according to claim 21, wherein the semiconductor material comprises an organic semiconductor material.

24. The method according to claim 21, wherein the conductive material of the third film comprises a conjugated polymer.

25. The method according to claim 21, wherein the conductive material of the third film comprises a colloid of an inorganic conductive material.

26. The method according to claim 21, wherein:
the first film and the second film are patterned such that the source electrode is coupled to a first of the strips, the drain electrode is coupled to a pixel electrode, and the gate electrode is fabricated to extend into contact with a second of the strips arranged orthogonal to the first strip, such that the first and second strips function, respectively, as a data line and a gate line of an active matrix addressing scheme for a display device.

27. The method according to claim 26, wherein:
the second of the strips are provided as conductive strip-like segments and the first film and second film are patterned to provide source and drain electrodes in a region of the substrate arranged in a space between two of the strip-like segments, and the gate electrode is deposited so as to extend between the two of the strip-like segments.

28. The method according to claim 26, wherein:
the inkjet printed fourth film comprises a first insulator material; and
before the step of forming a gate electrode, the fourth film is provided with an additional film comprising an insulator material which differs from the first insulator material.

29. The method according to claim 21, wherein:
at least one of the first area and areas of conductive material are fabricated to include at least one of an interconnect of the thin film transistor and to extend into contact with input, output, and voltage supply terminals for an electronic circuit and provided as discrete areas in the first film and the second film on the substrate.

30. The method according to claim 29, further comprising:
fabricating at least two thin film transistors, one of the thin film transistors being fabricated by depositing a first semiconductor material of a first conductivity type and another of the thin film transistors being fabricated by depositing a second semiconductor material of a second conductivity type opposite to the first type.

31. The method according to claim 29, further comprising:
fabricating resistive circuit components extending between discrete areas of the first film and the second film on the substrate.

* * * * *